(12) United States Patent
Kim et al.

(10) Patent No.: US 10,910,790 B2
(45) Date of Patent: Feb. 2, 2021

(54) SEMICONDUCTOR DEVICE PACKAGE AND METHOD FOR PRODUCING SAME

(71) Applicant: LG INNOTEK CO., LTD., Seoul (KR)

(72) Inventors: Baek Jun Kim, Seoul (KR); Ho Jae Kang, Seoul (KR); Hui Seong Kang, Seoul (KR); Keon Hwa Lee, Seoul (KR); Yong Gyeong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/465,461

(22) PCT Filed: Dec. 13, 2017

(86) PCT No.: PCT/KR2017/014664
§ 371 (c)(1),
(2) Date: May 30, 2019

(87) PCT Pub. No.: WO2018/110982
PCT Pub. Date: Jun. 21, 2018

(65) Prior Publication Data
US 2020/0036161 A1   Jan. 30, 2020

(30) Foreign Application Priority Data
Dec. 15, 2016 (KR) .......................... 10-2016-0171467

(51) Int. Cl.
*H01S 5/022* (2006.01)
*H01S 5/024* (2006.01)
*H01S 5/183* (2006.01)

(52) U.S. Cl.
CPC ........ *H01S 5/02469* (2013.01); *H01S 5/0228* (2013.01); *H01S 5/02208* (2013.01); *H01S 5/183* (2013.01)

(58) Field of Classification Search
CPC ..... H01S 5/183; H01S 5/0228; H01S 5/02208
See application file for complete search history.

(56) References Cited

U.S. PATENT DOCUMENTS

2006/0245195 A1\* 11/2006 Kim ........................ H01L 33/62
362/294
2007/0126010 A1\* 6/2007 Chua ................. H01L 31/02327
257/79

(Continued)

FOREIGN PATENT DOCUMENTS

CN     102779932 A     11/2012
CN     105529318 A     4/2016
(Continued)

OTHER PUBLICATIONS

Illuminator Chips for Different Wavelengths.

*Primary Examiner* — Yuanda Zhang
(74) *Attorney, Agent, or Firm* — Birch, Stewart, Kolasch & Birch, LLP

(57) ABSTRACT

Embodiments pertain to a semiconductor device package, a method of manufacturing the semiconductor device package, and an autofocusing apparatus including the semiconductor device package. The semiconductor device package according to an embodiment may include: a package body; a diffusion unit; and a vertical cavity surface emitting laser (VCSEL) semiconductor device disposed on a support and under the diffusion unit. According to the embodiment, the package body may include the support, a first sidewall protruding to a first thickness from an edge region of an upper surface of the support and having a first upper surface of a first width, and a second sidewall protruding to a second thickness from the first upper surface of the first side wall and having a second upper surface of a second width, wherein the support, the first sidewall, and the second sidewall may be integrally formed with the same material. The diffusion unit may be disposed on the first upper surface of the first sidewall and may be disposed to be surrounded by the second sidewall.

20 Claims, 20 Drawing Sheets

(56) References Cited

U.S. PATENT DOCUMENTS

| | | | |
|---|---|---|---|
| 2010/0091633 A1* | 4/2010 | Furuyashikii | H01L 27/14618 369/112.23 |
| 2011/0109713 A1* | 5/2011 | Yamaguchi | G02B 26/10 347/224 |
| 2012/0104436 A1* | 5/2012 | Ng | H01L 33/62 257/98 |
| 2012/0286319 A1 | 11/2012 | Lee et al. | |
| 2012/0313717 A1 | 12/2012 | Ridley et al. | |
| 2013/0049563 A1 | 2/2013 | Kim et al. | |
| 2013/0234274 A1* | 9/2013 | Kam | H01L 33/58 257/432 |
| 2016/0111581 A1 | 4/2016 | Prajuckamol et al. | |
| 2016/0155911 A1* | 6/2016 | Abe | H01L 33/486 257/99 |
| 2016/0254397 A1 | 9/2016 | Senn et al. | |
| 2016/0306265 A1 | 10/2016 | Riel et al. | |
| 2016/0352071 A1 | 12/2016 | Hogan et al. | |

FOREIGN PATENT DOCUMENTS

| | | |
|---|---|---|
| JP | 2006-313896 A | 11/2006 |
| JP | 2007-142425 A | 6/2007 |
| JP | 2008-227232 A | 9/2008 |
| JP | 2012-244170 A | 12/2012 |
| KR | 10-2012-0127184 A | 11/2012 |
| KR | 10-2013-0072412 A | 7/2013 |
| KR | 10-2014-0063539 A | 5/2014 |
| KR | 10-2016-0036555 A | 4/2016 |
| WO | WO 2016/013978 A1 | 1/2016 |

\* cited by examiner

[FIG. 1]
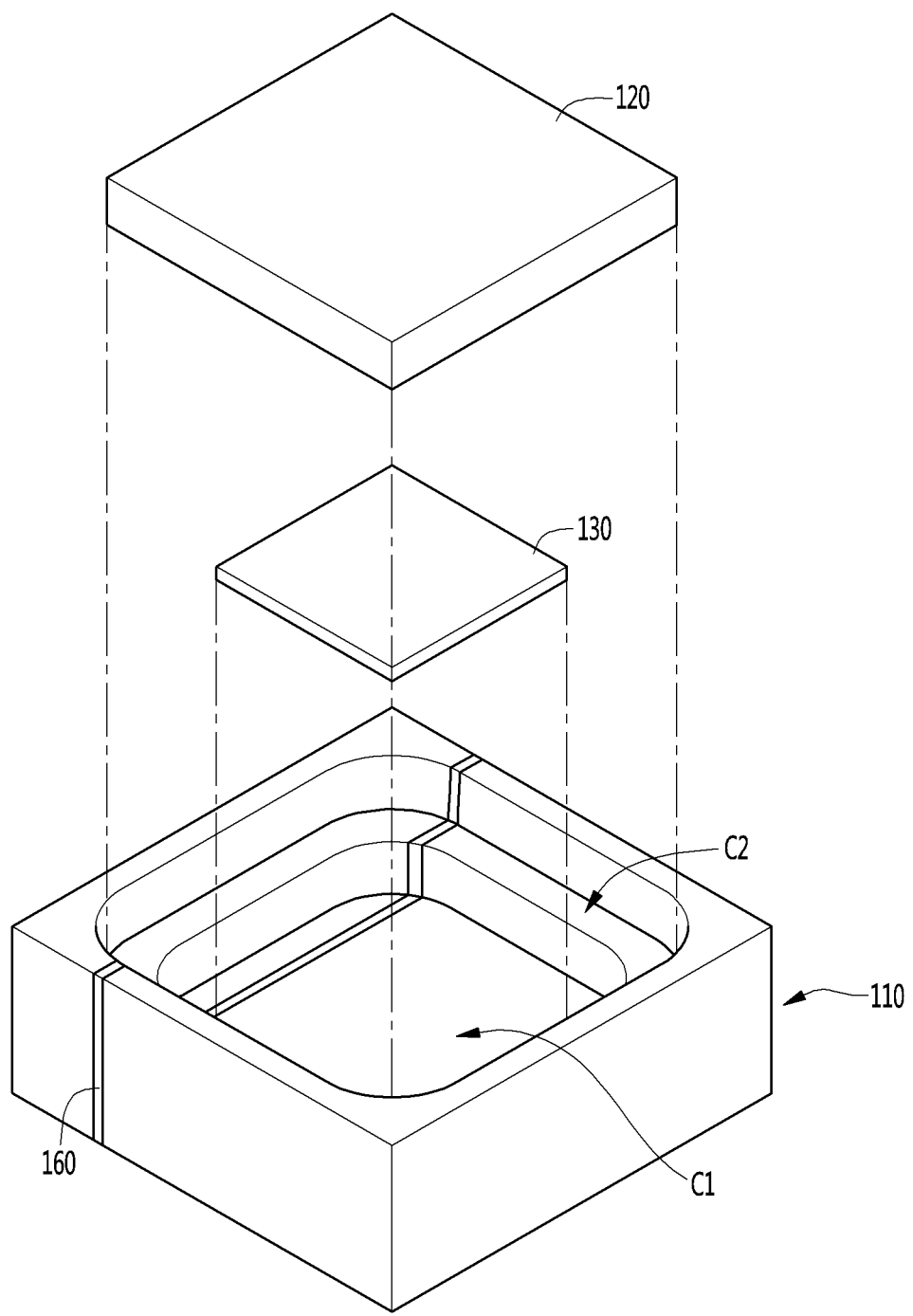

[FIG. 2]
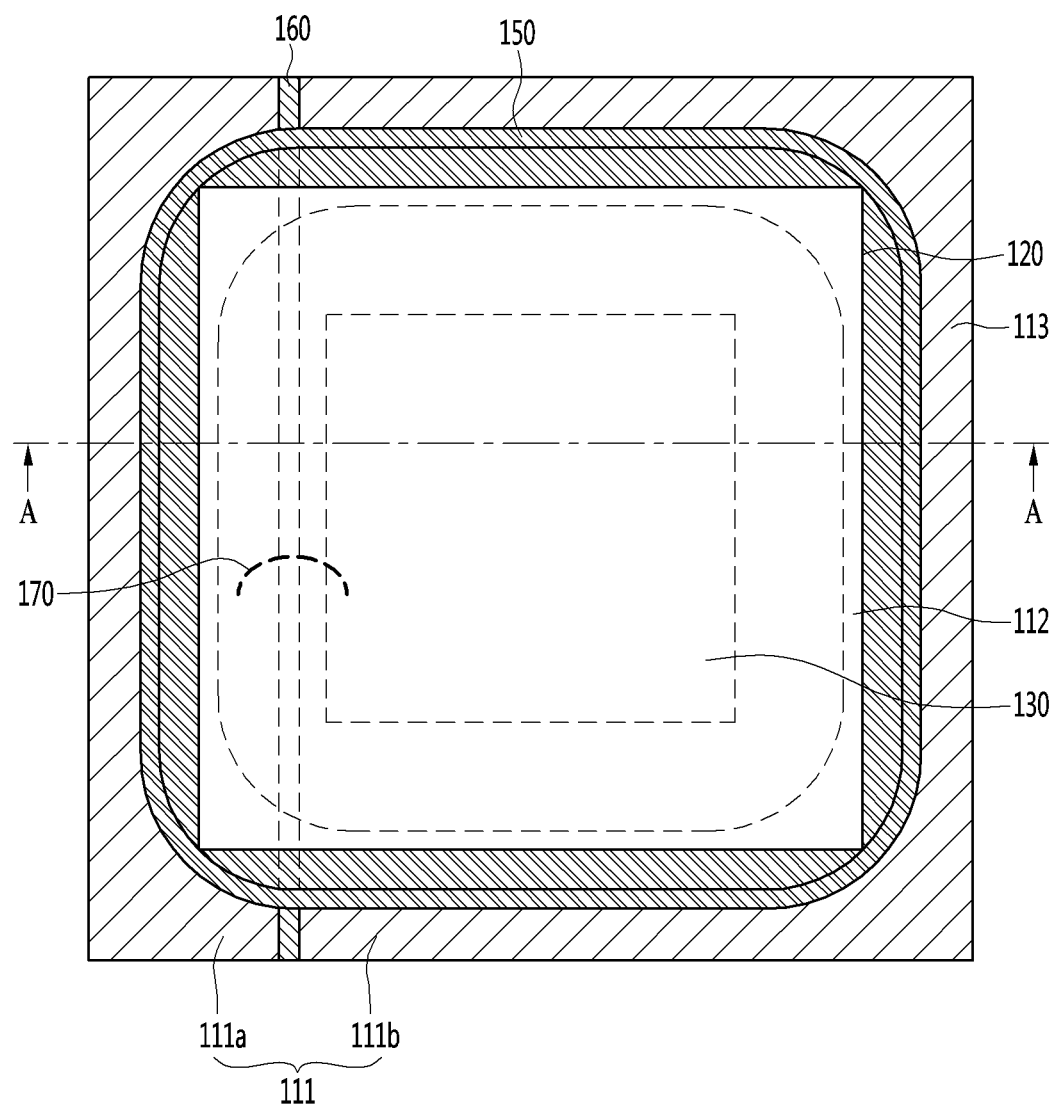

[FIG. 3]
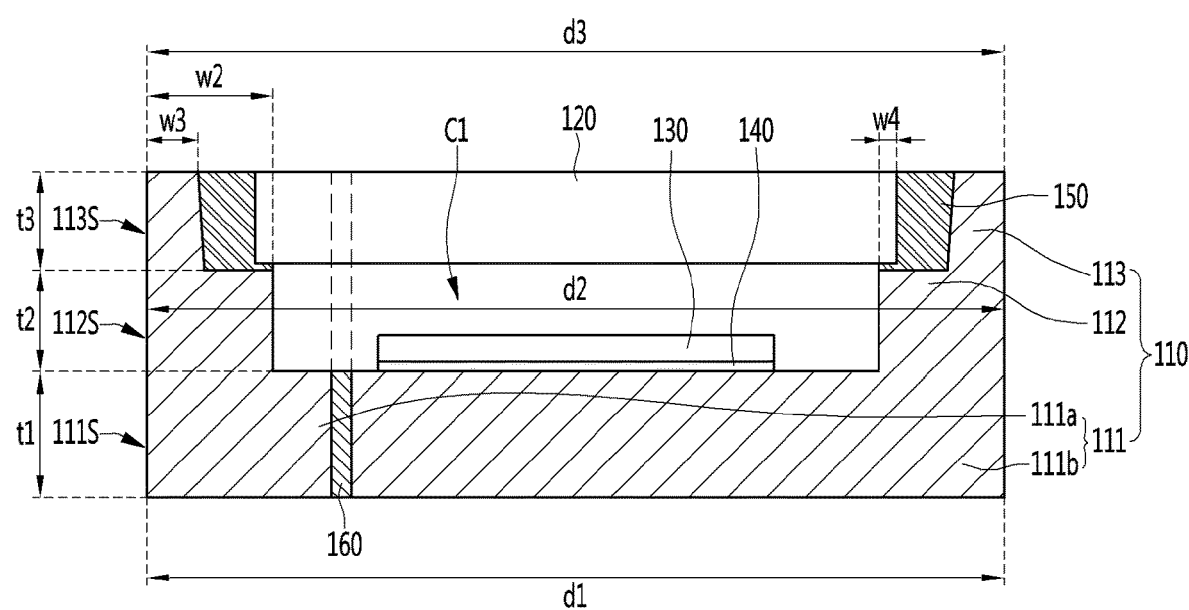

【FIG. 4】
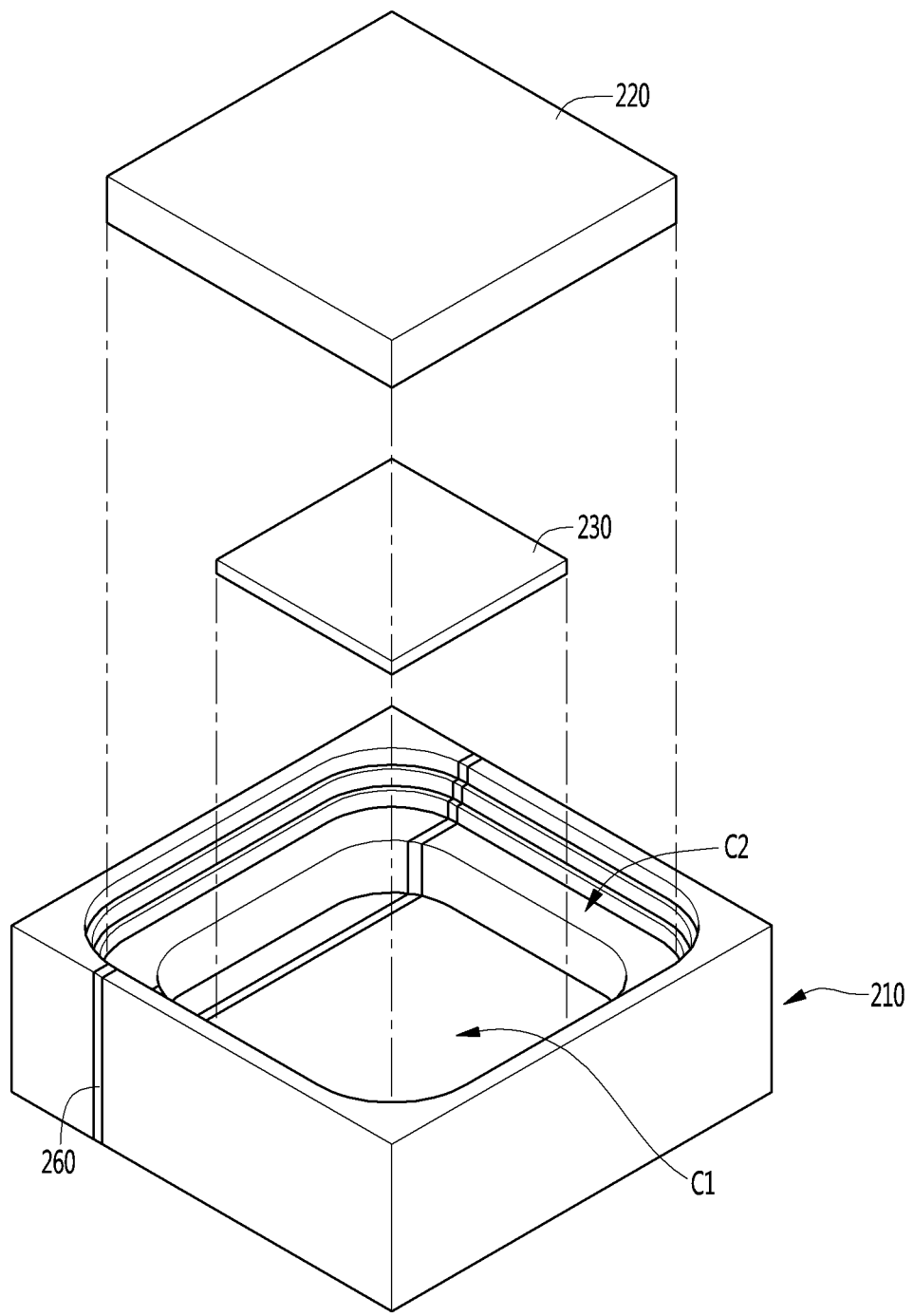

[FIG. 5]
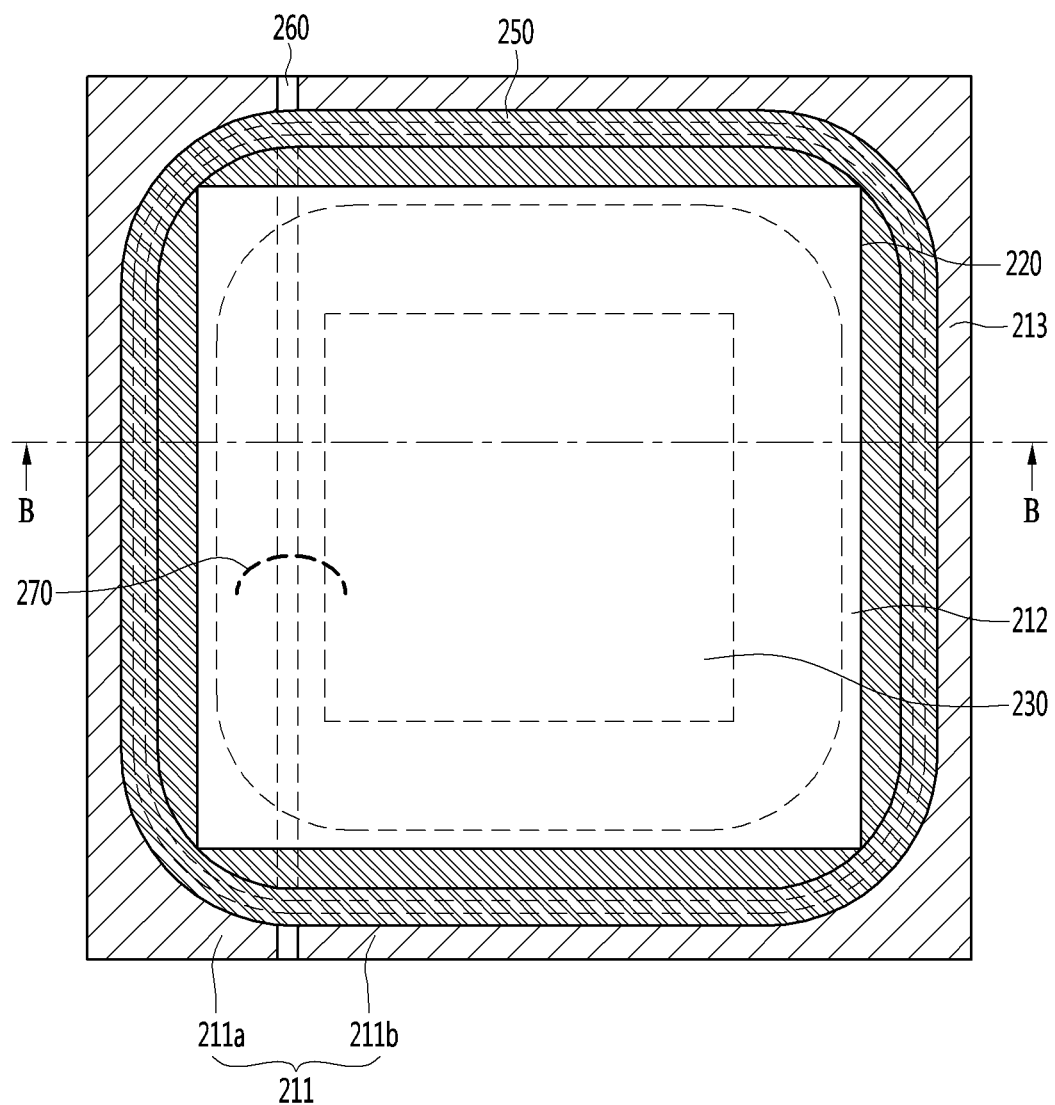

[FIG. 6]
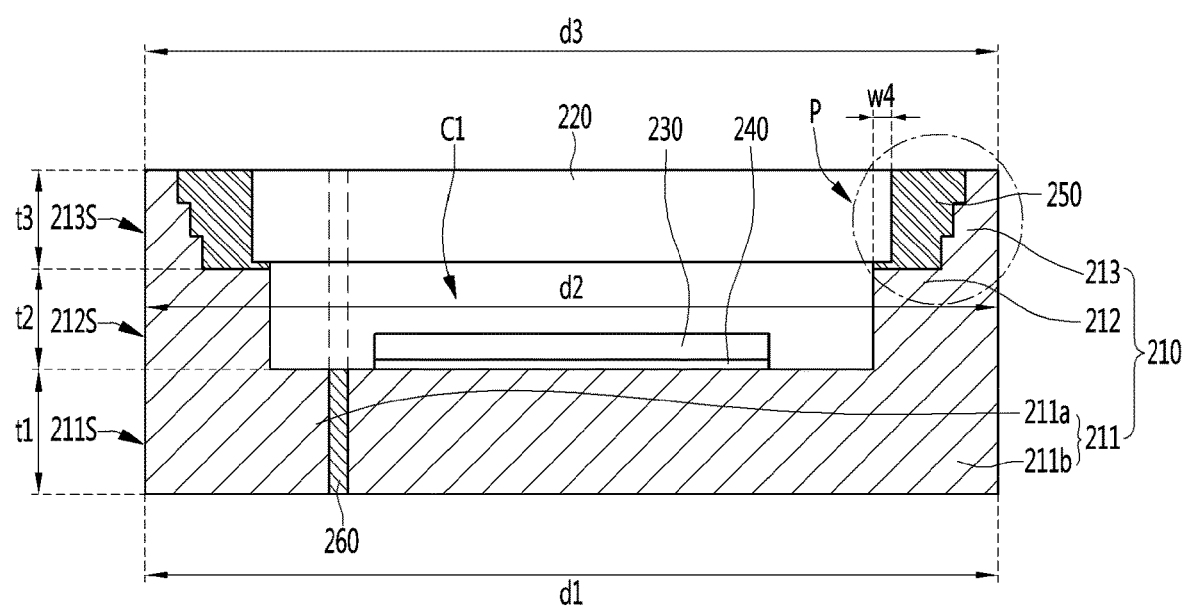

[FIG. 7]
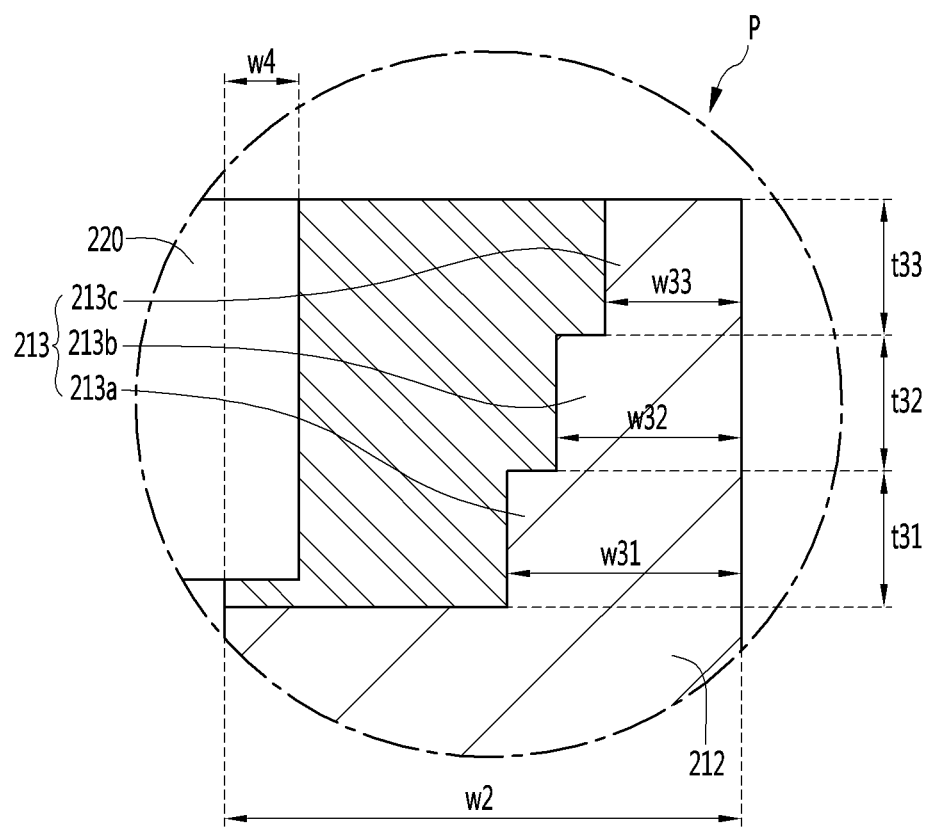

【FIG. 8】
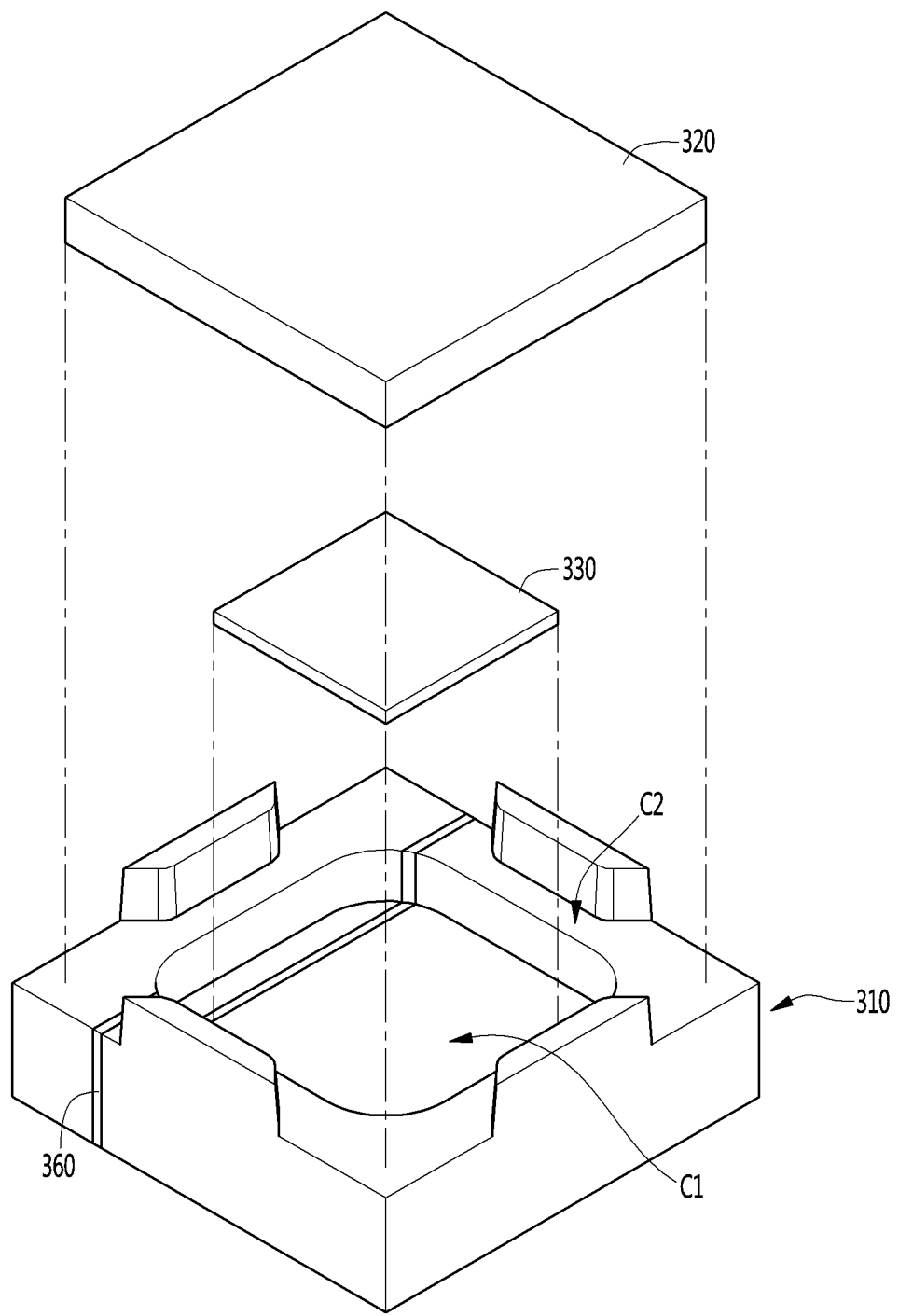

[FIG. 9]
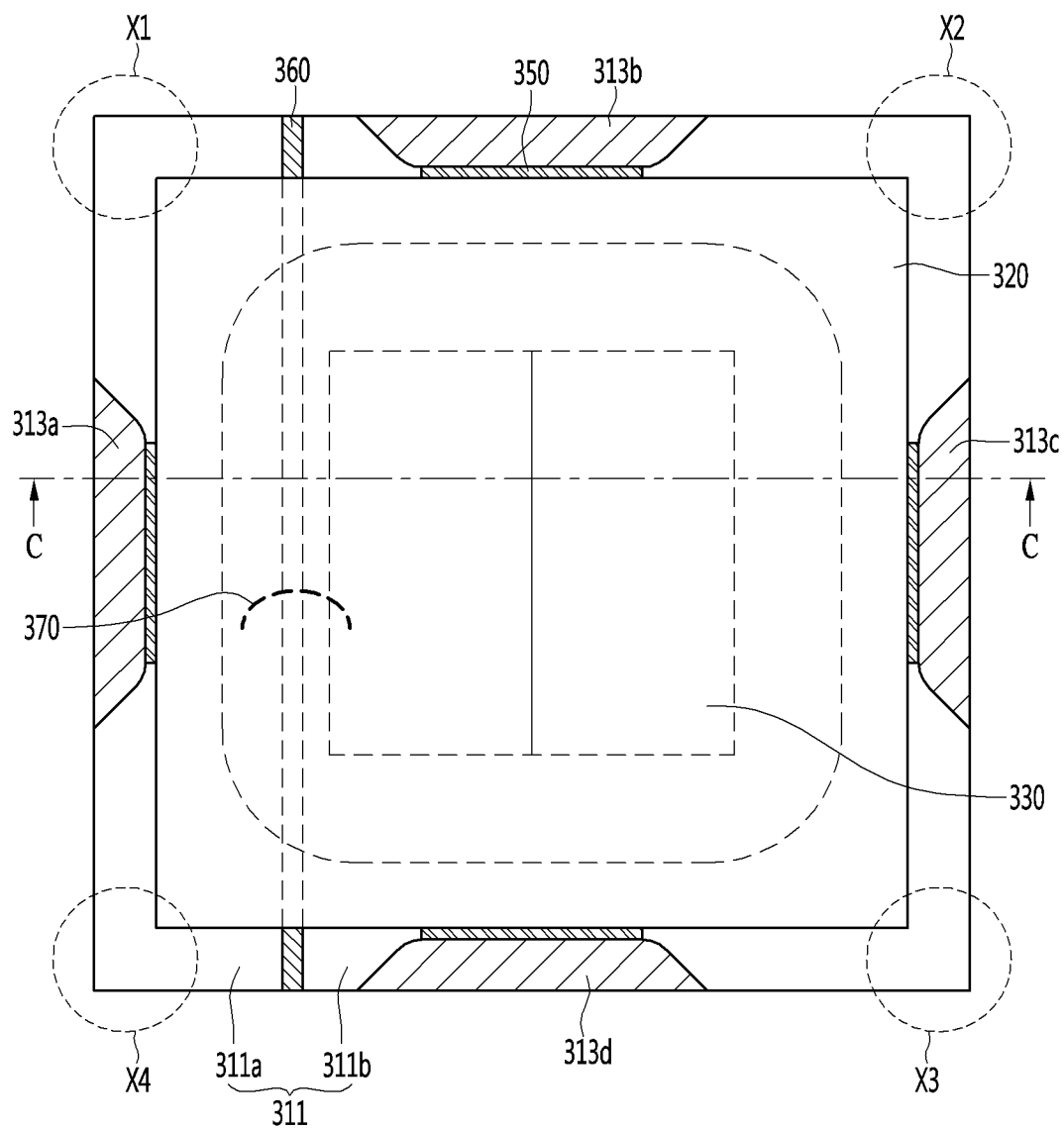

[FIG. 10]
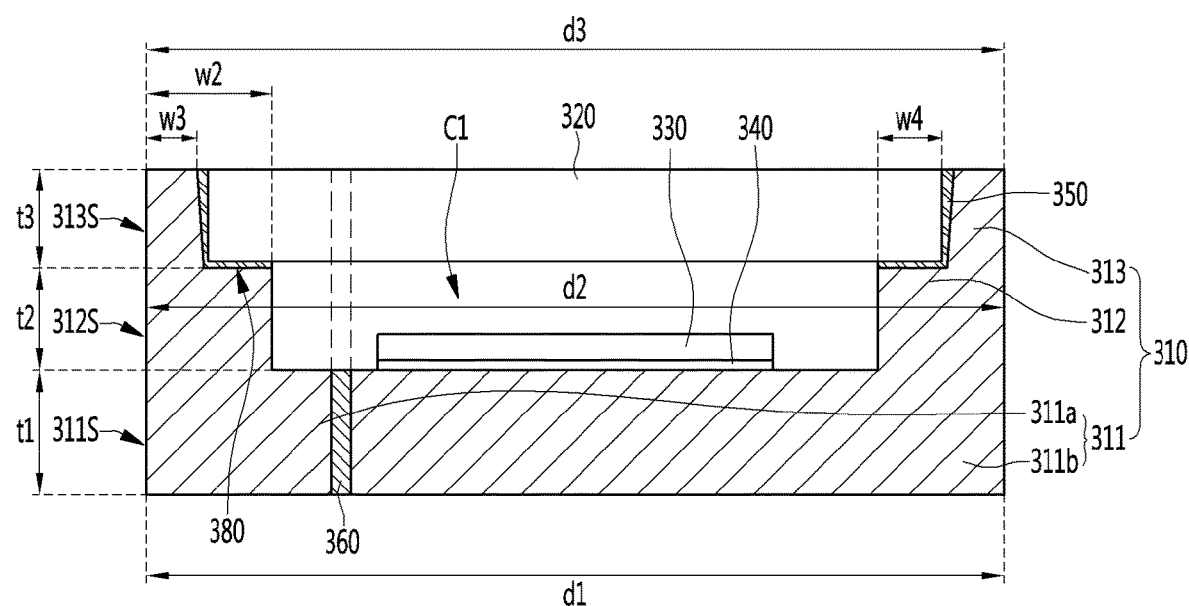

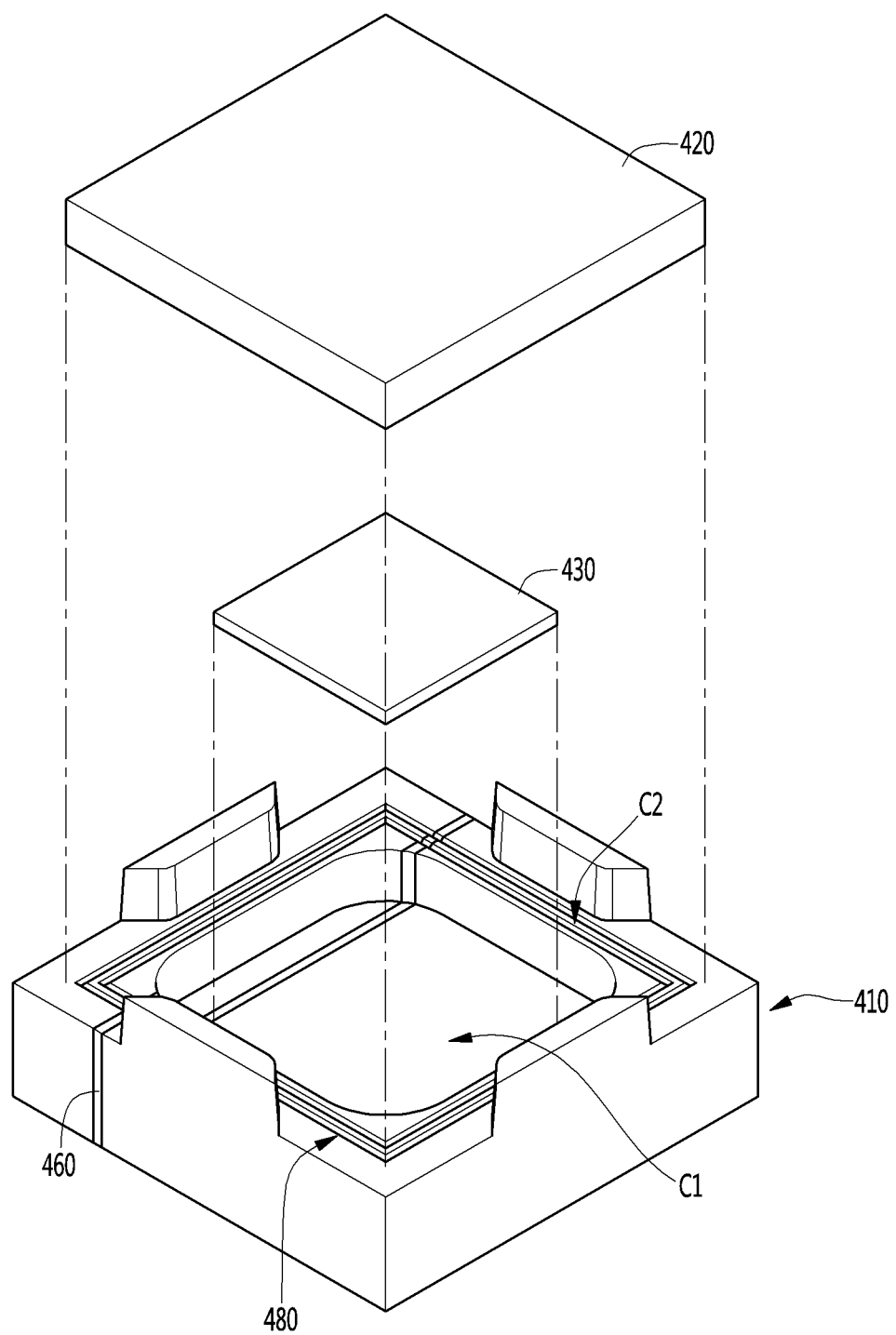
【FIG. 11】

[FIG. 12]
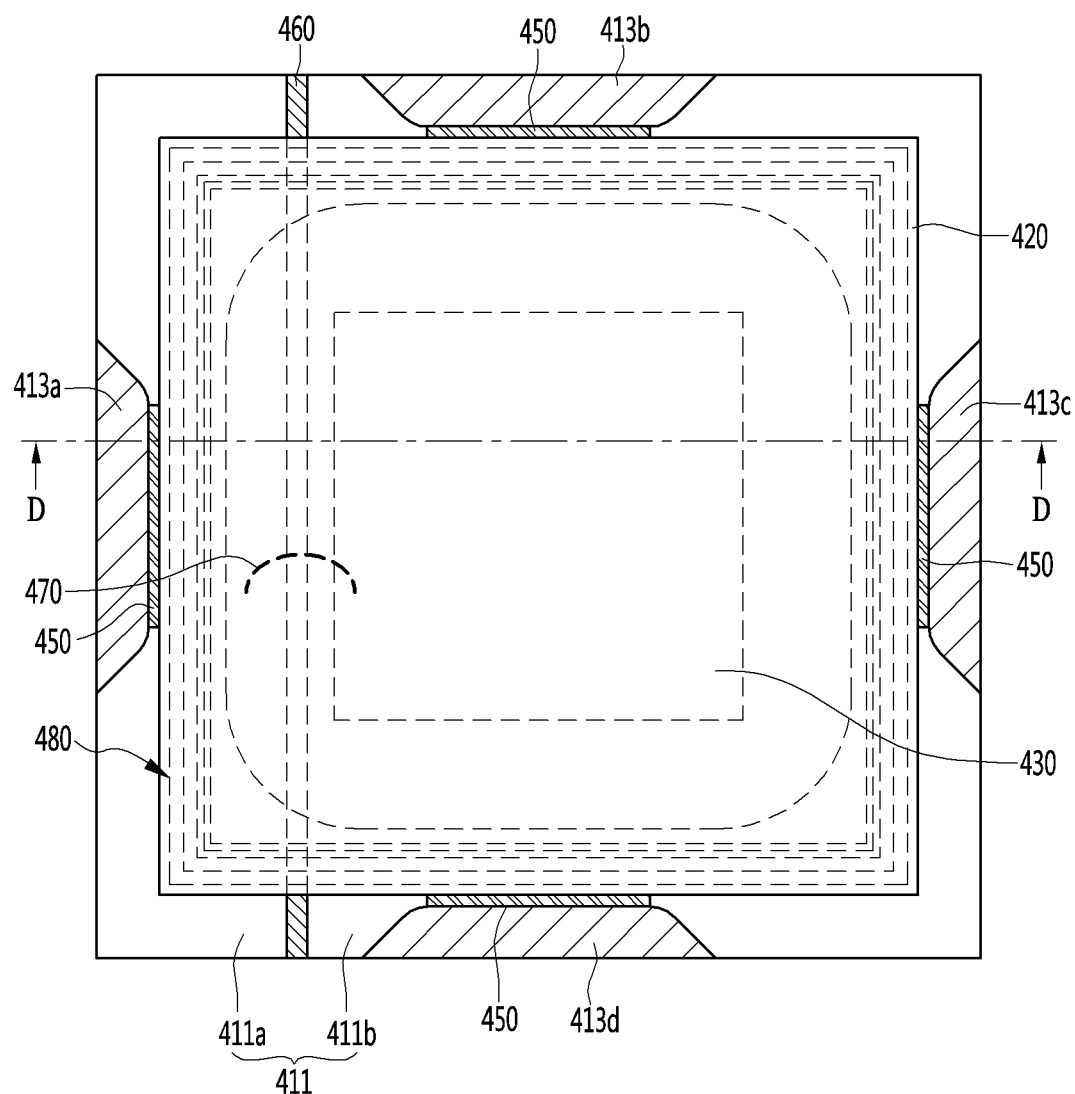

[FIG. 13]
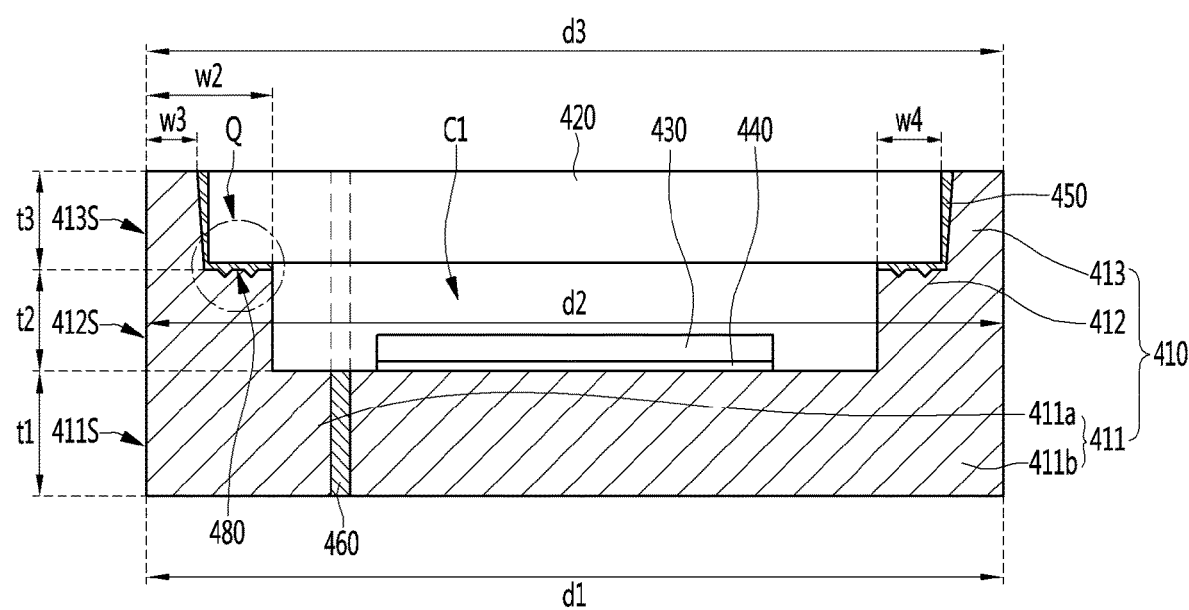

[FIG. 14]
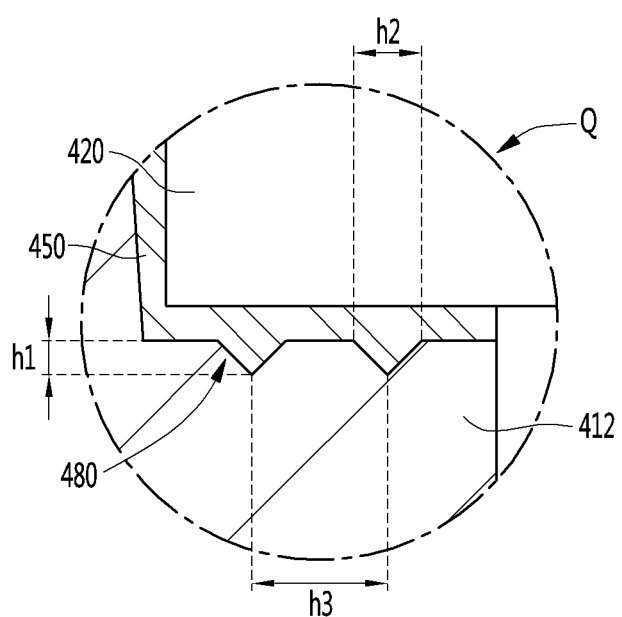

[FIG. 15]
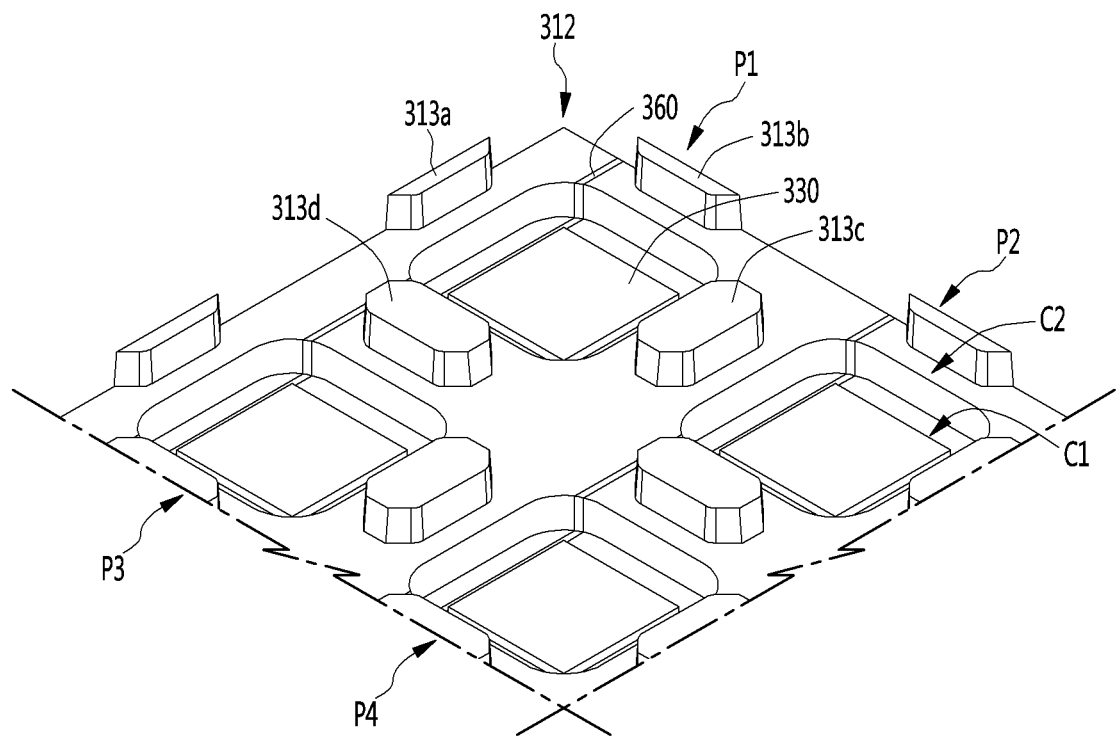

[FIG. 16]
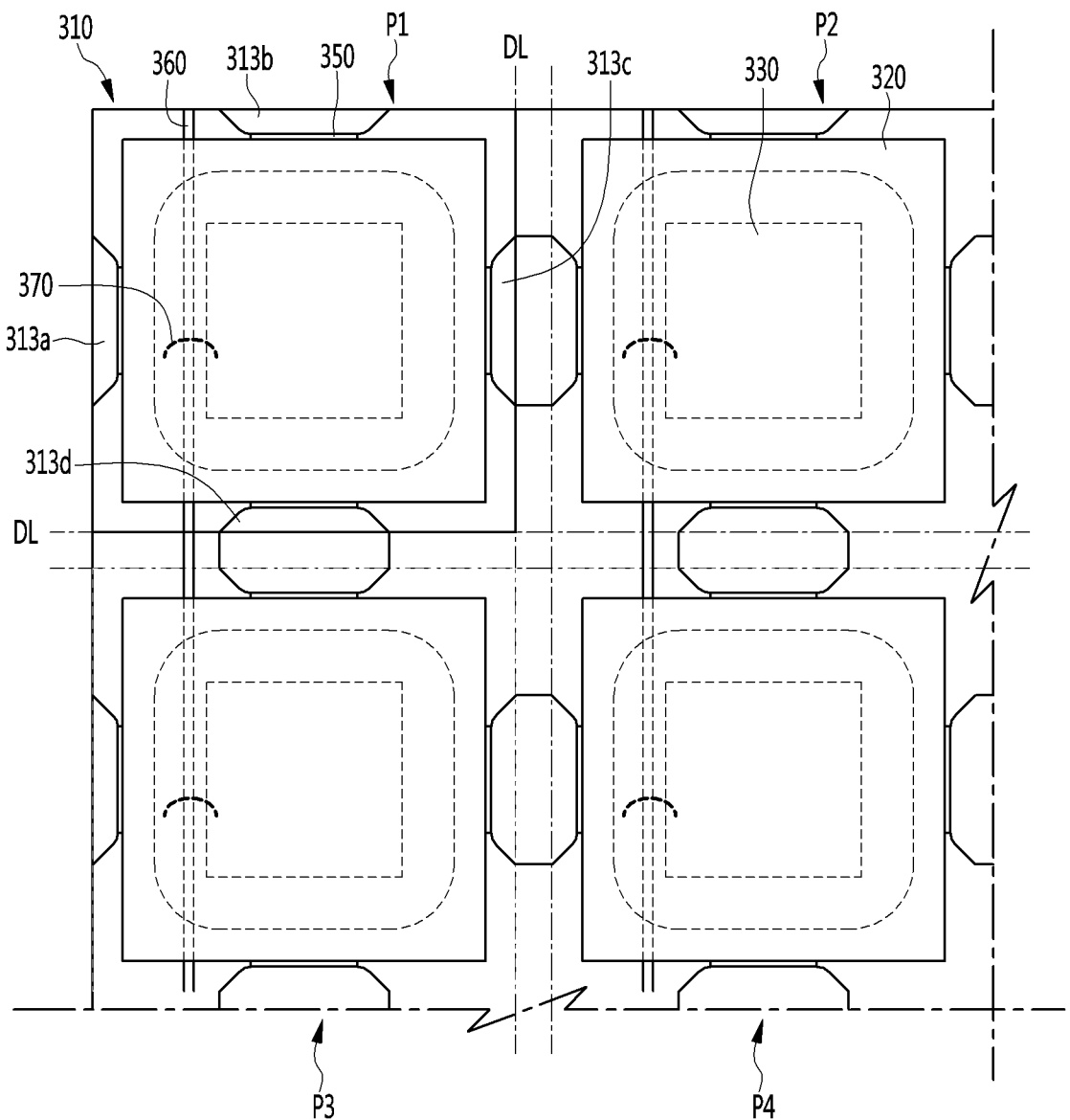

[FIG. 17]
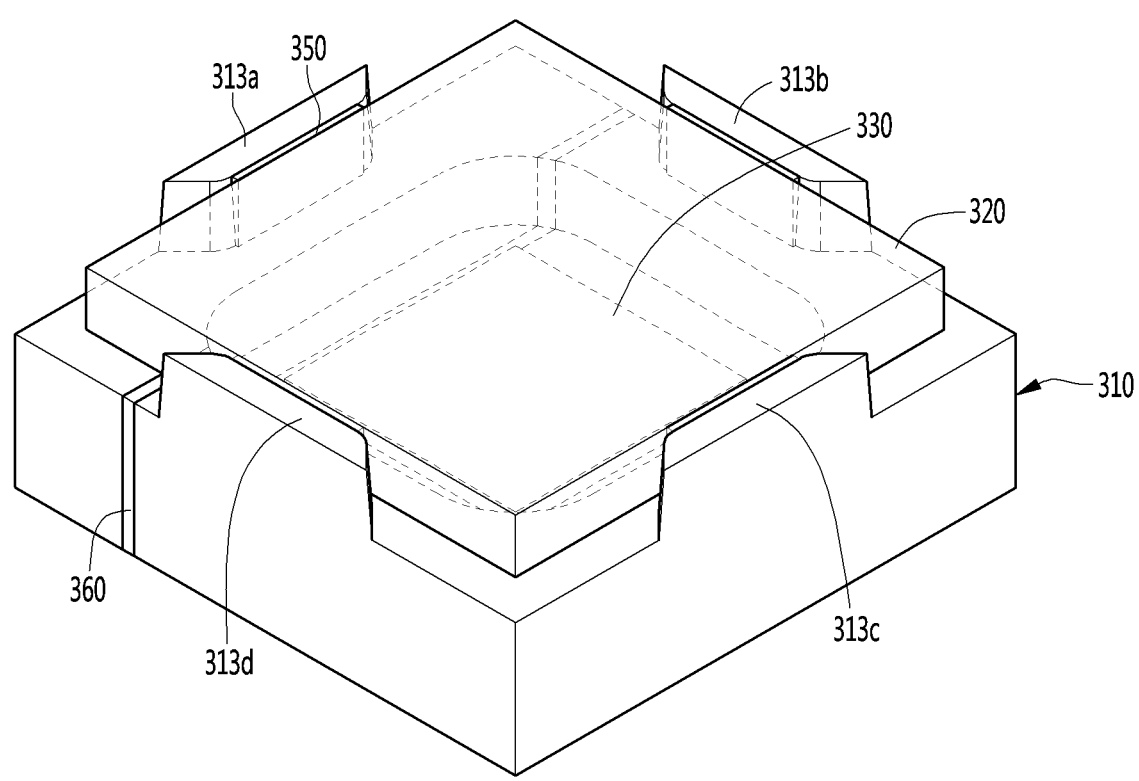

[FIG. 18]
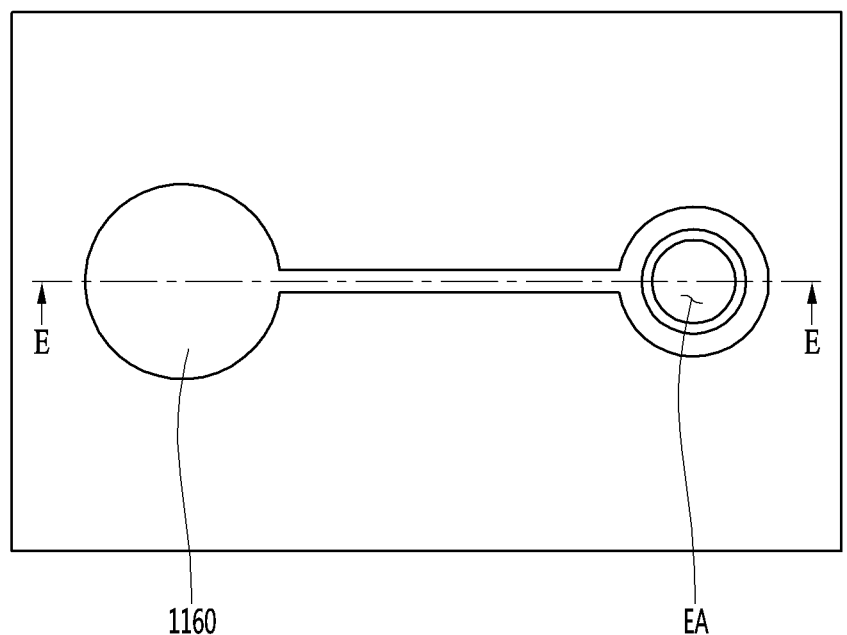

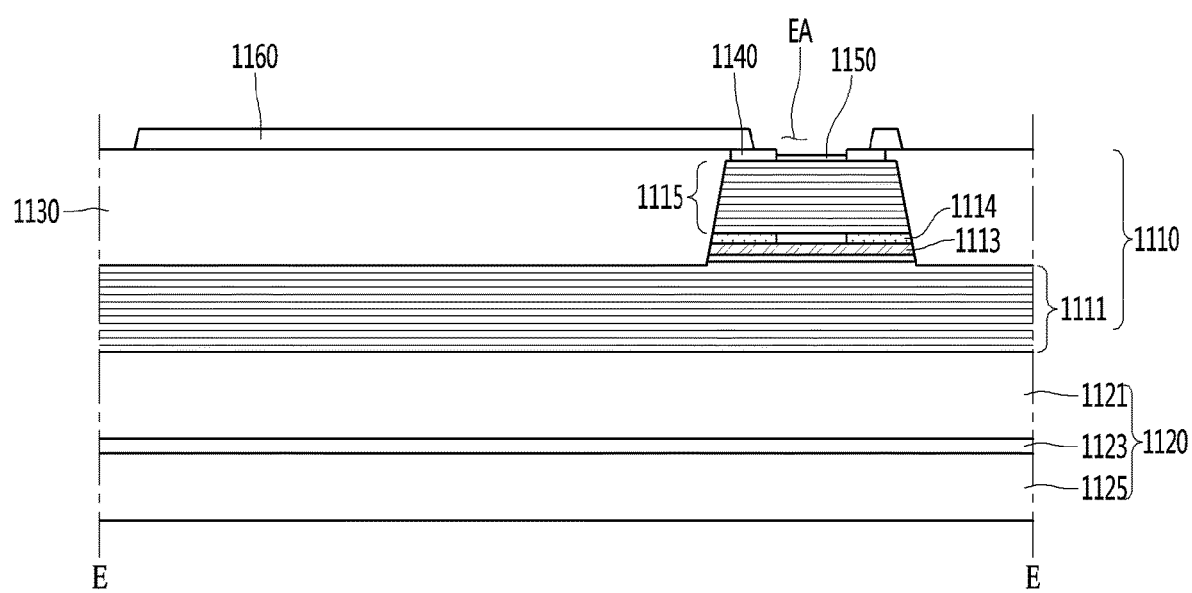
[FIG. 19]

[FIG. 20]
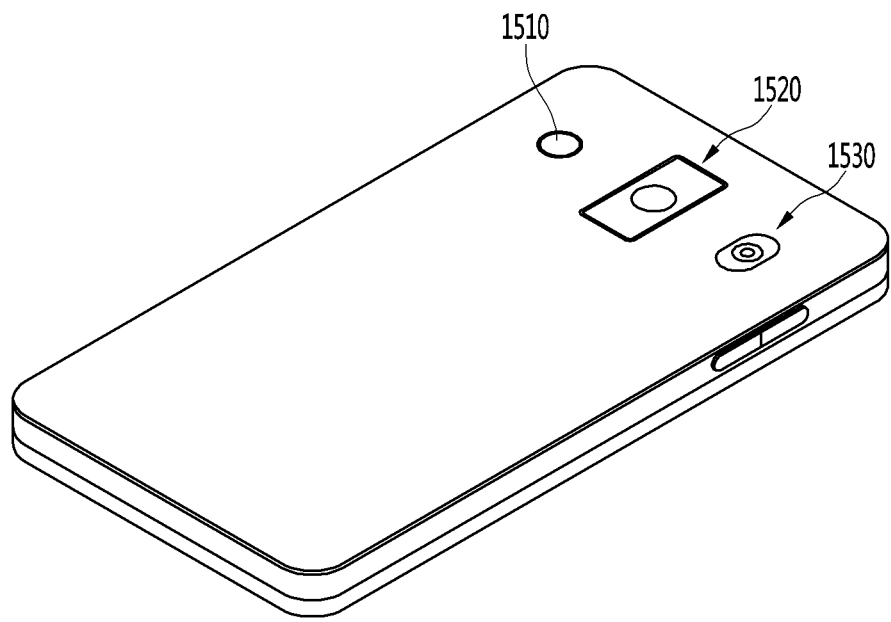

SEMICONDUCTOR DEVICE PACKAGE AND METHOD FOR PRODUCING SAME

CROSS REFERENCE TO RELATED APPLICATIONS

This application is the National Phase of PCT International Application No. PCT/KR2017/014664, filed on Dec. 13, 2017, which claims priority under 35 U.S.C. 119(a) to Patent Application No. 10-2016-0171467, filed in the Republic of Korea on Dec. 15, 2016, all of which are hereby expressly incorporated by reference into the present application.

TECHNICAL FIELD

Embodiments relate to a semiconductor device package, a method of manufacturing a semiconductor device package, and an autofocusing apparatus comprising the semiconductor device package.

BACKGROUND ART

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

Semiconductor devices are required to have high output and high voltage driving as their application fields become diverse. The temperature of the semiconductor device package is increased by the heat generated in the semiconductor device due to the high output and high voltage driving of the semiconductor device. Accordingly, there is a demand for a method for efficiently dissipating heat generated in a semiconductor device package. In addition, miniaturization of a semiconductor device package is strongly required for miniaturization of a product. Therefore, there is an increasing demand for a semiconductor device package that can efficiently dissipate heat generated in a semiconductor device while being small-sized.

DETAIL DESCRIPTION OF THE INVENTION

Technical Problem

An embodiment can provide a semiconductor device package that is small in size and excellent in heat dissipation characteristics and a method of manufacturing the same.

An embodiment can provide a semiconductor device package which is excellent in mechanical stability and can safely protect an element disposed therein from an external impact and a method of manufacturing the same.

Embodiments can provide a semiconductor device package that can provide high output light and prevent moisture from penetrating into the interior, and a method of manufacturing the same.

An embodiment can provide an autofocusing apparatus including a semiconductor device package which is provided in a small size and can provide a high output light with excellent heat dissipation characteristics.

Technical Solution

A semiconductor device package according to an embodiment may comprise a package body including a support, a first sidewall protruding from an edge region of an upper surface of the support to a first thickness and having a first upper surface of a first width, and a second sidewall protruding from the first upper surface of the first sidewall to a second thickness and having a second upper surface of a second width, and the support, the first sidewall, and the second sidewall being formed by one body of the same material; a diffusion unit disposed on the first upper surface of the first sidewall and surrounded by the second sidewall; and a vertical cavity surface emitting laser (VCSEL) semiconductor device disposed on the support and disposed under the diffusion unit.

According to the embodiment, wherein an outer surface of the support, an outer surface of the first sidewall, and an outer surface of the second sidewall may be provided in one plane without a step.

According to the embodiment, wherein a thickness of the vertical cavity surface emitting laser (VCSEL) semiconductor device may be provided smaller than the first thickness of the first sidewall.

According to the embodiment, wherein a thickness of the diffusion unit may be equal to or less than the thickness of the second sidewall.

The semiconductor device package according to the embodiment may comprise an adhesive layer provided between the diffusion unit and the second sidewall.

According to the embodiment, wherein the support may comprise a first support and a second support that are spaced apart from each other and electrically insulated, and the vertical cavity surface emitting laser (VCSEL) semiconductor device may be disposed on the first support or the second support, and the semiconductor device package may further comprise an adhesive layer provided between the first support and the second support.

The semiconductor device package according to the embodiment may comprise a metal layer disposed between the vertical cavity surface emitting laser (VCSEL) semiconductor device and the support.

According to the embodiment, wherein the package body may be formed of a metal.

According to the embodiment, wherein an inner side surface of the second sidewall may be formed in a plurality of stepped shapes.

According to the embodiment, wherein a width of the upper surface of the first sidewall may be equal to a width of a lower surface of the first sidewall.

According to the embodiment, wherein the second sidewall may be disposed between a first corner region of the first sidewall and a second corner region adjacent to the first corner region, and may not disposed at the first corner region and the second corner region of the first sidewall, and wherein the diffusion unit may be disposed to face an inner side surface of the second sidewall and extends from the inner side surface of the second sidewall toward the first corner region and the second corner region.

According to the embodiment, the semiconductor device package may comprise concave portion provided at the first upper surface of the first sidewall supporting the diffusion unit.

According to the embodiment, the semiconductor device package may comprise an adhesive layer disposed between the concave portion and a lower surface of the diffusion unit.

According to the embodiment, wherein the second sidewall may comprise the second upper surface having the second width, and wherein a lower surface of the second sidewall may be provided wider than the second width and smaller than the first width of the first upper surface of the first sidewall.

A semiconductor device package according to an embodiment may comprise a package body including a support, a first sidewall disposed on an outer region of an upper surface of the support to provide a first cavity, and a second sidewall disposed on the first sidewall to provide a second cavity, and the support, the first sidewall, and the second sidewall being formed by one body of the same material; a semiconductor device disposed on a central region of the support and provided in the first cavity; a diffusion unit disposed on the semiconductor device, disposed on an upper surface of the first sidewall, and disposed in the second cavity surrounded by the second sidewall, wherein an outer surface of the support, an outer surface of the first sidewall, and an outer surface of the second sidewall may be provided in one plane without a step.

According to the embodiment, wherein the support may comprise a first support and a second support which are disposed to be spaced apart from each other and are electrically insulated, and wherein the semiconductor device may be provided on the first support or the second support and wherein the semiconductor device package may further comprise an adhesive layer disposed between the first support and the second support.

According to the embodiment, wherein the second sidewall may be disposed between a first corner region of the first sidewall and a second corner region adjacent to the first corner region, and may not be disposed at the first corner region and the second corner region of the first sidewall, and wherein the diffusion unit may be disposed to face an inner side surface of the second sidewall and may extend from the inner side surface of the second sidewall toward the first corner region and the second corner region.

An autofocusing apparatus according to an embodiment may comprise a semiconductor device package comprising a package body including a support, a first sidewall protruding from an edge region of an upper surface of the support to a first thickness and having a first upper surface of a first width, and a second sidewall protruding from the first upper surface of the first sidewall to a second thickness and having a second upper surface of a second width, and the support, the first sidewall, and the second sidewall being formed by one body of the same material; a diffusion unit supported by the first upper surface of the first sidewall and surrounded by the second sidewall: and a vertical cavity surface emitting laser (VCSEL) semiconductor device disposed on the support and disposed under the diffusion unit; and a light receiving unit receiving reflected light of light emitted from the vertical cavity surface emitting laser (VCSEL) semiconductor device.

An autofocusing apparatus according to an embodiment may comprise a semiconductor device package comprising a package body including a support, a first sidewall disposed on an outer region of an upper surface of the support to provide a first cavity, and a second sidewall disposed on the first sidewall, and the support, the first sidewall, and the second sidewall being formed by one body of the same material; a semiconductor device disposed on a central region of the support and disposed in the cavity; a diffusion unit disposed on the semiconductor device, supported by an upper surface of the first sidewall, and surrounded by the second sidewall, wherein an outer surface of the support, an outer surface of the first sidewall, and an outer surface of the second sidewall may be provided in one plane without a step: and a light receiving unit receiving reflected light of light emitted from the semiconductor device package.

A method of manufacturing a semiconductor device package according to an embodiment may comprises providing a metal substrate; forming a plurality of package bodies by processing the metal substrate, each of the plurality of package bodies includes a support, a first sidewall protruding from an edge region of an upper surface of the support to a first thickness and having a first upper surface of a first width, and a second sidewall protruding from the first upper surface of the first sidewall to a second thickness and having a second upper surface of a second width; providing a vertical cavity surface emitting laser (VCSEL) semiconductor device on a region of the support surrounded by the first sidewall of each package body, respectively; providing a diffusion unit in a region surrounded by the second sidewall, the diffusion unit being supported by the first upper surface of the first sidewall of each of the package bodies; and dicing and separating the metal substrate into a plurality of semiconductor device packages, each semiconductor device package including the package body, the vertical cavity surface emitting laser (VCSEL) semiconductor device, and the diffusion unit.

Advantageous Effects

According to a semiconductor device package of an embodiment, there is an advantage that the semiconductor device package is small in size and has good heat dissipation characteristics.

According to a semiconductor device package of an embodiment, there is an advantage that the mechanical stability is excellent and the elements disposed inside can be safely protected from external impacts.

According to a semiconductor device package of an embodiment, there is an advantage that it can provide high output light and prevent moisture from penetrating into the inside.

According to a method of manufacturing a semiconductor device package of an embodiment, there is an advantage that the semiconductor device package which is small in size and excellent in heat dissipation characteristics and provides high output light can be manufactured quickly and stably.

According to a method of manufacturing a semiconductor device package of an embodiment, there is an advantage that the manufacturing process can be simplified and the manufacturing cost can be reduced.

According to an autofocusing apparatus of an embodiment, there is an advantage that it is small in size, has excellent heat dissipation characteristics, and can provide high output light.

DESCRIPTION OF DRAWINGS

FIG. 1 is an exploded perspective view showing a semiconductor device package according to an embodiment of the present invention.

FIG. 2 is a plan view of a semiconductor device package according to an embodiment of the present invention.

FIG. 3 is a cross-sectional view taken along line A-A of the semiconductor device package shown in FIG. 2.

FIG. 4 is an exploded perspective view showing another example of a semiconductor device package according to an embodiment of the present invention.

FIG. 5 is a plan view showing another example of a semiconductor device package according to an embodiment of the present invention.

FIG. 6 is a cross-sectional view taken along line B-B of the semiconductor device package shown in FIG. 5.

FIG. 7 is an enlarged view of the region of P shown in FIG. 6.

FIG. 8 is an exploded perspective view showing another example of a semiconductor device package according to an embodiment of the present invention.

FIG. 9 is a plan view showing another example of a semiconductor device package according to an embodiment of the present invention.

FIG. 10 is a cross-sectional view taken along line C-C of the semiconductor device package shown in FIG. 9.

FIG. 11 is an exploded perspective view showing another example of a semiconductor device package according to an embodiment of the present invention.

FIG. 12 is a plan view showing another example of the semiconductor device package according to the embodiment of the present invention.

FIG. 13 is a cross-sectional view taken along line D-D of the semiconductor device package shown in FIG. 12.

FIG. 14 is an enlarged view of the region of Q shown in FIG. 13.

FIGS. 15 to 17 are views showing a method of manufacturing a semiconductor device package according to an embodiment of the present invention.

FIG. 18 is a plan view showing a semiconductor device according to an embodiment of the present invention.

FIG. 19 is a cross-sectional view taken along the line E-E of the semiconductor device shown in FIG. 18.

FIG. 20 is a perspective view of a mobile terminal to which an autofocusing apparatus including a semiconductor device package according to an embodiment of the present invention is applied.

MODE FOR INVENTION

Hereinafter, embodiments will be described with reference to the accompanying drawings. In the description of the embodiments, in the case that each layer (film), region, pattern or structure may be referred to as provided "on/over" or "under" a substrate, each layer (film), region, pad, or pattern, the terms "on/over" and "under" include both "directly" and "indirectly interposed with another layer". In addition, "on/over" or "under" of each layer will be described based on the drawings, but the embodiments are not limited thereto.

Hereinafter, a semiconductor device package according to an embodiment of the present invention, a method of manufacturing the semiconductor device package, and an autofocusing apparatus including the semiconductor device package will be described in detail with reference to the accompanying drawings.

First, a semiconductor device package according to an embodiment of the present invention will be described with reference to FIGS. 1 to 3. FIG. 1 is an exploded perspective view showing a semiconductor device package according to an embodiment of the present invention, FIG. 2 is a plan view showing the semiconductor device package according to an embodiment of the present invention, and FIG. 3 is a cross-sectional view taken along line A-A of the semiconductor device package shown in FIG. 2.

The semiconductor device package according to the embodiment may comprise a package body 110 and a semiconductor device 130 disposed on the package body 110. The package body 110 may comprise a support 111, a first sidewall 112, and a second sidewall 113. For example, the semiconductor device 130 may be disposed on the support 111.

According to the embodiment, the support 111, the first sidewall 112, and the second sidewall 113 may be formed of the same material. In addition, the support 111, the first sidewall 112, and the second sidewall 113 may be integrally formed. For example, the package body 110 may comprise a first cavity C1 provided by the first sidewall 112 and a second cavity C2 provided by the second sidewall 113. The first cavity C1 and the second cavity C2 may be formed by a mechanical process using a tool such as a drill, but are not limited thereto.

According to the embodiment, the package body 110 may comprise a metal. The package body 110 may comprise at least one of metals including aluminum (Al), copper (Cu), gold (Au), silver (Ag). The package body 110 may be formed of a single metal or an alloy. Further, a plating layer may be further disposed on a surface of the package body 110 to reflect light emitted from the semiconductor device 130. In this case, the plating layer may be formed of a material having a good reflection characteristic with respect to the wavelength band of the light emitted from the semiconductor device 130. For example, when the light emitted from the semiconductor device 130 is in the wavelength band of the infrared region, the package body 110 may be formed of aluminum (Al) or an aluminum alloy, and gold (Au) may be formed on the surface of the package body 110 as a plating layer.

According to the semiconductor device package of the embodiment, since the package body 110 is formed of a metal having excellent heat dissipation characteristics, the heat dissipation effect can be improved. The package body 110 can efficiently dissipate heat generated from the semiconductor device 130 to the outside. In addition, since the semiconductor device 130 is disposed in the package body 110 integrally formed of a metal material and has mechanical stability, even when the semiconductor device package is dropped or impacted from the outside, the semiconductor device package can be prevented from being damaged.

In addition, the semiconductor device package according to the embodiment may comprise a diffusion unit 120. The diffusion unit 120 may be disposed on the semiconductor device 130. The diffusion unit 120 may be disposed on the package body 110. The diffusion unit 120 may be supported by the package body 110. The diffusion unit 120 may be supported by the first sidewall 112 of the package body 110. The diffusion unit 120 may be disposed in the second cavity C2 surrounded by the second sidewall 113. The diffusion unit 120 may comprise a function of expanding a beam angle of light emitted from the semiconductor device 130. The diffusion unit 120 may comprise, for example, a micro lens, a concavo-convex pattern, or the like.

In addition, the diffusion unit 120 may comprise an anti-reflective function. For example, the diffusion unit 120 may comprise an anti-reflection layer disposed on a surface facing the semiconductor device 130. The diffusion unit 120 may comprise an anti-reflection layer disposed on a lower surface facing the semiconductor device 130. The anti-reflection layer prevents light incident from the semiconductor device 130 from being reflected on the surface of the diffusion unit 120 and transmits the light, thereby reducing light loss due to reflection.

The non-reflective layer may be formed of, for example, an anti-reflective coating film and attached to the surface of the diffusion unit 120. Further, the non-reflective layer may be formed on the surface of the diffusion unit 120 through spin coating, spray coating, or the like. For example, the anti-reflection layer may be formed as a single layer or a multilayer including at least one of the group including $TiO_2$, $SiO_2$, $Al_2O_3$, $Ta_2O_3$, $ZrO_2$, and $MgF_2$.

The semiconductor device 130 according to the embodiment may be selected from a light emitting device including a light emitting diode device and a laser diode device. For example, the semiconductor device 130 may be a vertical cavity surface emitting laser (VCSEL) semiconductor device. The vertical cavity surface emitting laser (VCSEL) semiconductor device can emit beams in the upper direction at the upper surface. The vertical cavity surface emitting laser (VCSEL) semiconductor device can emit beams upward in a beam angle of, for example, 15 degrees to 25 degrees. The vertical cavity surface emitting laser (VCSEL) semiconductor device may comprise a single light emitting aperture or multiple light emitting apertures that emit a circular beam. An example of the vertical cavity surface emitting laser (VCSEL) semiconductor device will be described later.

As shown in FIGS. 1 to 3, the semiconductor device package according to the embodiment may comprise the package body 110 including the first cavity C1 and the second cavity C2, and the semiconductor device 130 disposed in the first cavity C1 of the package body 110. In addition, the semiconductor device package according to the embodiment may comprise the diffusion unit 120 disposed in the second cavity C2 of the package body 110.

The package body 110 may comprise the support 111, the first sidewall 112 disposed on the support 111, and the second sidewall 113 disposed on the first sidewall 112.

The first sidewall 112 may be disposed at an edge region of an upper surface of the support 111. The first sidewall 112 may be disposed on an outer peripheral region of the upper surface of the support 111. The first sidewall 112 may protrude from the edge region of the upper surface of the support 111 to a first thickness t2. The first cavity C1 may be formed in a central region of the upper surface of the support 111 by the first sidewall 112. The first sidewall 112 may protrude upward from the upper surface of the support 111 to the first thickness t2 and may comprise a first upper surface of a first width w2.

The first width w2 of the first upper surface of the first sidewall 112 and a lower surface of the first sidewall 112 may be equal to each other. In this case, the first width w2 of the first upper surface of the first sidewall 112, which can support the diffusion unit 120, can be stably formed. The width w4 of the area of the first upper surface area of the first sidewall 112 that overlaps with the diffusion unit 120 in the vertical direction and supports the diffusion unit 120 may be determined by the adhesive force, and mechanical stability, and may be formed with 200 micrometers or more as an example. The width w4 of the area supporting the diffusion unit 120 may be about 18% to 22% of the width of the diffusion unit 120. If the width w4 of the area supporting the diffusion unit 120 is less than 18% of the width of the diffusion unit 120, the diffusion unit 120 may not be stably supported. When the width w4 of the area supporting the diffusion unit 120 is larger than 22% of the width of the diffusion unit 120, there is a disadvantage that the size of the diffusion unit 120 becomes excessively large, and the size of the semiconductor device package becomes large. The width w4 of the area supporting the diffusion unit 120 can be adjusted according to the bondability between the diffusion unit 120 and the package body 110. Alternatively, the first width w2 of the first upper surface of the first sidewall 112 may be formed to be smaller than the width of the lower surface of the first sidewall 112. The angle provided by an inner surface of the first sidewall 112 and the upper surface of the support 111 may be formed at an obtuse angle greater than 90 degrees, and the degree of freedom in the process of forming the package body 110 can be improved. The inclination angle of the first sidewall 112 may be selectively determined in consideration of the size of the semiconductor device 130, the size of the diffusion unit 120, the processing conditions of the package body 110, and the like.

The second sidewall 113 may be disposed on the first sidewall 112. The second sidewall 113 may protrude upwardly from the first upper surface of the first sidewall 112 with a second thickness t3. The second sidewall 113 may be disposed in an edge region of the first upper surface of the first sidewall 112. The second sidewall 113 may protrude upward from the edge region of first upper surface of the first sidewall 112 with the second thickness t3. The second cavity C2 surrounded by the second sidewall 113 may be formed. The second sidewall 113 may comprise a second upper surface of a second width w3. A lower surface of the second sidewall 113 may be wider than the second width w3. The lower surface of the second sidewall 113 may be formed smaller than the first width w2 of the first upper surface of the first sidewall 112. Accordingly, the diffusion unit 120 can be disposed on the upper surface of the first sidewall 112. The second width w3 of the second sidewall 113 may be, for example, 50 micrometers to 250 micrometers in consideration of strength characteristics of the material forming the package body 110, mechanical working conditions, and the like. If the second width w3 of the second sidewall 113 is less than 50 micrometers, the second sidewall 113 may have a low strength, which may lower the mechanical stability of the semiconductor device package. If the second width w3 of the second sidewall 113 is greater than 250 micrometers, there is a disadvantage that the semiconductor device package becomes large.

The diffusion unit 120 may be supported by the first upper surface of the first sidewall 112. The diffusion unit 120 may be surrounded by the second sidewall 113. The diffusion unit 120 may be disposed in the second cavity C2 formed by the second sidewall 113. An edge region of the lower surface of the diffusion unit 120 may be supported by the first upper surface of the first sidewall 112. The thickness of the diffusion unit 120 may be the same as the second thickness t3 of the second sidewall 113. Also, the thickness of the diffusion unit 120 may be smaller than the second thickness t3 of the second sidewall 113. Since the thickness of the diffusion unit 120 is equal to or smaller than the second thickness t3 of the second sidewall 113, the diffusion unit 120 can be protected by the second sidewall 113. That is, it is possible to prevent the diffusion unit 120 from being damaged even when the semiconductor device package according to the embodiment drops or receives an external impact.

The semiconductor device 130 may be disposed on the support 111. The semiconductor device 130 may be disposed on the upper surface of the support 111. The semiconductor device 130 may be disposed under the diffusion unit 120. The semiconductor device 130 may be disposed in a central region of the upper surface of the support 111 and may be disposed in the first cavity C1. A thickness of the semiconductor device 130 may be smaller than the first thickness t2 of the first sidewall 112. An upper surface of the semiconductor device 130 may be spaced apart from the lower surface of the diffusion unit 120.

An outer surface 111S of the support 111, an outer surface 112S of the first sidewall 112, and an outer surface 113S of the second sidewall 113 may be formed without a step. The outer surface 111S of the support 111, the outer surface 112S of the first sidewall 112, and the outer surface 113S of the second sidewall 113 may be formed so as to form one plane without a step each other. A distance d1 between the outer surfaces 111S of the support 111, a distance d2 between the outer surfaces 112S of the first sidewall 112, and a distance d3 between the outer surfaces 113S of the second sidewall may be the same. The semiconductor device package according to the embodiment is not manufactured in a single package but may be formed as an individual semiconductor device package through a cutting process such as dicing after manufacturing a plurality of semiconductor device packages connected in a matrix form. Accordingly, the semiconductor device package according to the embodiment can be mass-produced efficiently, and its outer surface can be formed in the same plane without a step along the cutting line.

The semiconductor device package according to the embodiment may comprise a first adhesive layer 150 provided between the diffusion unit 120 and the second sidewall 113. The first adhesive layer 150 may be disposed between the second sidewall 113 and the side surface of the diffusion unit 120. The first adhesive layer 150 may be disposed between the lower surface of the diffusion unit 120 and the first upper surface of the first sidewall 112. The first adhesive layer 150 may be disposed between the lower surface of the diffusion unit 120 and the first upper surface of the first sidewall 112 to a thickness of several micrometers to several tens of micrometers. For example, the first adhesive layer 150 may be provided at 5 micrometers to 30 micrometers. When the first adhesive layer 150 is formed to have a thickness of less than 5 micrometers, the adhesive strength is weak and the diffusion unit 120 and the first sidewall 112 may not be stably fixed. In addition, when the first adhesive layer 150 is formed to have a thickness of more than 30 micrometers, the thickness of the second sidewall 113 must be increased by increasing the thickness of the first adhesive layer 150, then it may be a limitation in downsizing the semiconductor device package.

The first adhesive layer 150 allows the diffusion unit 120 to be stably fixed in the second cavity C2. The first adhesive layer 150 allows the diffusion unit 120 to be stably supported by the first sidewall 112. The first adhesive layer 150 allows the diffusion unit 120 to be stably disposed in the second sidewall 113. Accordingly, in the semiconductor device package according to the embodiment, the space formed by the diffusion unit 120 and the body 100 can be sealed by the first adhesive layer 150, and moisture or foreign matter can be effectively prevented from penetrating into the space where the semiconductor device 130 is disposed, and reliability can be improved.

For example, the first adhesive layer 150 may comprise an organic material. The first adhesive layer 150 may comprise an epoxy-based resin. The first adhesive layer 150 may comprise a silicone-based resin.

According to the embodiment, the support 111 may comprise a first support 111a and a second support 111b. The first support 111a and the second support 111b may be spaced apart from each other. The first support 111a and the second support 111b may be electrically insulated from each other. The semiconductor device 130 may be disposed on the first support 111a or the second support 111b.

The semiconductor device package according to the embodiment may comprise a second adhesive layer 160 disposed between the first support 111a and the second support 111b. The second adhesive layer 160 may electrically insulate the first support 111a and the second support 111b. In addition, the second adhesive layer 160 provides a function of physically and stably coupling the first support 111a and the second support 111b. The second adhesive layer 160 provides electrical insulation and adhesion between the first support 111a and the second support 111b. The package body 110 according to the embodiment may comprise a first package body 110a and a second package body 110b coupled by the second adhesive layer 160.

For example, the second adhesive layer 160 may comprise an organic material. The second adhesive layer 160 may comprise an epoxy-based resin. The second adhesive layer 160 may comprise a silicone-based resin.

The semiconductor device package according to the embodiment may further comprise a metal layer 140 provided between the semiconductor device 130 and the support 111. For example, the semiconductor device 130 may be electrically connected to the first support 111a by wire bonding through a wire 170. In addition, the semiconductor device 130 may be electrically connected to the second support 111b through die bonding. The metal layer 140 may be disposed between the semiconductor device 130 and the second support 111b. For example, the metal layer 140 may be disposed in a die bonding region between the semiconductor device 130 and the second support 111*b*. The metal layer 140 may improve adhesion between the semiconductor device 130, a die paste for die bonding, and the second support 111*b*. The metal layer 140 may be selected in consideration of the die paste material, the die bonding region material of the semiconductor device 130, and the like. For example, the metal layer 140 may be formed as a single layer or a multilayer including at least one of metals including gold (Au), aluminum (Al), copper (Cu), and silver (Ag). The metal layer 140 may be formed of a single metal or an alloy. For example, the metal layer 240 may be formed by a plating process or the like.

The metal layer 140 may provide a metal bond between the semiconductor device 130 and the support 111. Accordingly, according to the embodiment, heat dissipation characteristics in which heat generated in the semiconductor device 130 is transferred to the support 111 can be improved. Also, from an electrical point of view, the current injection characteristic to be applied to the semiconductor device 130 through the support 111 can be improved. For example, a thickness of the metal layer 140 may be in the range of 0.04 micrometers to 0.4 micrometers. The thickness of the metal layer 140 may be selectively changed according to the process of die bonding. For example, the thickness of the metal layer 140 may be 0.2 micrometers to 0.4 micrometers when eutectic bonding is applied. The thickness of the metal layer 140 may be 0.04 micrometers to 0.06 micrometers when pick and place bonding is applied.

According to the embodiment, as shown in FIG. 2, when viewed from the upper direction, the package body 110 may have a rectangular shape. An example of a method of manufacturing a semiconductor package according to an embodiment will be described later, but the outer surface of the package body 110 may be formed by a cutting process such as dicing. Accordingly, the outer surface of the package body 110 may be formed perpendicular to the upper surface of the support 111. That is, the outer surface 111S of the support 111, the outer surface 112S of the first sidewall 112, and the outer surface 113S of the second sidewall 113 may be arranged on the same plane without a step each other.

The package body 110 may be formed, for example, by mechanical processing by a tool such as a drill. Accordingly, a rounded inner side surface having a curvature that is not a straight line may be formed in a region where two adjacent sides of the first sidewall 112 meet. In other words, the side area of the first cavity C1 provided by the first side wall 112 is formed in a linear shape, and the corner area between two neighboring sides may be formed into a shape having a curvature. Also, an inner side surface of a rounded shape having a curvature that is not a straight line may be formed in an area where two adjacent sides of the second sidewall 113 meet. In other words, the side area of the second cavity C2 formed by the second sidewall 113 may be formed in a linear shape, and the corner area between two neighboring sides may be formed into a shape having a curvature.

As shown in FIG. 3, the package body 110 may be formed to have a thickness including the support 111, the first sidewall 112, and the second sidewall 113. At this time, an individual thickness of each component can be selected in consideration of workability and mechanical stability of the package body 110.

For example, the thickness t1 of the support 111 may be 40% to 60% of the total thickness. The thickness of the support 111 may be 0.4 mm or more in consideration of workability and mechanical stability. If the thickness t1 of the support 111 is smaller than 0.4 mm, the support 111 would be damaged during the manufacturing process or during the use of the semiconductor device package after the semiconductor device package is manufactured. In addition, the maximum range of the thickness t1 of the support 111 may not be limited, but may be less than 1 millimeter, for example, in order to realize miniaturization of the product.

The thickness t2 of the first sidewall 112 may be selected in consideration of the thickness of the semiconductor device 130, the height required when wire bonding is applied, and the like. The thickness t3 of the second sidewall 113 may be selected in consideration of the thickness of the diffusion unit 120 and the like. The diffusion unit 120 may be formed to have a thickness of at least 0.3 millimeter in consideration of breakage or the like during handling. Accordingly, the thickness t3 of the second sidewall 113 may be 0.3 mm or more. In addition, the maximum range of the thickness t3 of the second sidewall 113 may be 0.5 mm or less, for example, in order to realize miniaturization of the product.

The package body 110 applied to the semiconductor device package according to the embodiment may be formed in a small volume having a width of several millimeters, a length of several millimeters, and a thickness of several millimeters. For example, the width and length of the package body 110 each may be about 3 millimeters to about 4 millimeters, and the overall thickness of the package body 110 may be about 1 millimeter to about 2 millimeters.

The semiconductor device package according to the embodiment described above is based on the case where the semiconductor device 130 is connected to the second support 111*b* by die bonding and is connected to the first support 111*a* by wire bonding. However, the electrical connection between the semiconductor device 130 and the support 111 may be variously modified. For example, the semiconductor device 130 may be electrically connected to the support 111 by a flip chip bonding method. The semiconductor device 130 may be electrically connected to the first support 111*a* and the second support 111*b* by a wire bonding method.

According to the embodiment, the first support 111*a* and the second support 111*b* may be arranged to receive power from the outside. As an example, a circuit board for power supply may be disposed under the support 111. The semiconductor device package according to the embodiment may be directly mounted on the circuit board.

In addition, the semiconductor device package according to the embodiment may further comprise an insulating layer disposed on the package body 110 to prevent electrical short due to external foreign matter. For example, a photo solder resist (PSR) may be disposed on the package body 110. The photo solder resist (PSR) may be disposed on the upper surface of the second sidewall 113 of the package body 110. The photo solder resist (PSR) may be formed on the uppermost surface of the package body 110 and may be formed in an area where the diffusion unit 120 is not disposed. The photo solder resist (PSR) may also be formed on the first adhesive layer 150 exposed by the diffusion unit 120. The photo solder resist (PSR) may also be formed on the second adhesive layer 160 exposed by the diffusion unit 120.

As described above, according to the semiconductor device package according to the embodiment, since the package body can be formed of a metal having excellent heat dissipation characteristics, the heat dissipation effect can be improved and the reliability can be improved while realizing a small size.

In addition, according to the semiconductor device package of the embodiment, since the package body is integrally formed of a metal material to provide mechanical stability, even when the semiconductor device package is dropped or receives an external impact, the semiconductor device and the diffusion unit, which are disposed in the package body, may be prevented from being damaged, and the reliability can be improved.

Meanwhile, according to the semiconductor device package of the embodiment, the semiconductor device 130 may be formed of a vertical cavity surface emitting laser (VCSEL) semiconductor device. The vertical cavity surface emitting laser (VCSEL) semiconductor device may comprise a single light emitting aperture or multiple light emitting apertures that emit a circular beam in the upper direction at the top surface. When a vertical cavity surface emitting laser (VCSEL) semiconductor device has a single light emitting aperture, the width and length of the semiconductor device each may be, for example, 100 micrometers to 150 micrometers. When a high output semiconductor device is required, a vertical cavity surface emitting laser (VCSEL) semiconductor device including a plurality of light emitting apertures may be used, the size of the semiconductor device may be increased to correspond to an increase in the number of light emitting apertures. In addition, when the lateral length and the longitudinal length of the semiconductor device are increased, the lateral length and longitudinal length of the diffusion unit also need to be increased correspondingly. That is, as the size of the semiconductor device increases, the size of the diffusion unit must also be increased. At this time, when the package body is limited to a certain size or less, the thickness of the first sidewall and the thickness of the second sidewall of the package body may be reduced corresponding to the size increase of the semiconductor device. As a result, the area of the upper surface of the first sidewall supporting the diffusion unit can be reduced, the space between the diffusion unit and the second sidewall can be reduced, and the adhesive force between the diffusion unit and the package body can be weakened.

As one of ways to improve this point, a semiconductor device package according to an embodiment shown in FIGS. 4 to 6 may be suggested.

Next, another example of the semiconductor device package according to the embodiment will be described with reference to FIGS. 4 to 6.

FIG. 4 is an exploded perspective view showing another example of a semiconductor device package according to an embodiment of the present invention, FIG. 5 is a plan view of the semiconductor device package shown in FIG. 4, and FIG. 6 is a cross-sectional view taken along line B-B of the semiconductor device package shown in FIG. 5. Referring to FIGS. 4 to 6, in explaining the semiconductor device package according to the embodiment, descriptions overlapping with those described with reference to FIGS. 1 to 3 may be omitted.

The semiconductor device package according to the embodiment may comprise a package body 210 and a semiconductor device 230 disposed on the package body 210, as shown in FIGS. 4 to 6. The package body 210 may comprise a support 211, a first sidewall 212, and a second sidewall 213. The semiconductor device 230 may be disposed on the support 211 as an example.

According to the embodiment, the support 211, the first sidewall 212, and the second sidewall 213 may be formed of the same material. The support 211, the first sidewall 212, and the second sidewall 213 may be integrally formed. For example, the package body 210 may comprise a first cavity C1 formed by the first sidewall 212 and a second cavity C2 formed by the second sidewall 213. The first cavity C1 and the second cavity C2 may be formed by mechanical processing using a tool such as a drill.

According to the embodiment, the package body 210 may be formed of metal. The package body 210 may comprise at least one of metals including aluminum (Al), copper (Cu), gold (Au), silver (Ag). The package body 210 may be formed of a single metal or an alloy.

According to the semiconductor device package of the embodiment, since the package body 210 is formed of a metal having excellent heat dissipation characteristics, the heat dissipation effect can be improved. The package body 210 can efficiently dissipate heat generated from the semiconductor device 230 to the outside. In addition, since the semiconductor device 230 is disposed in the package body 210 integrally formed of metal material and having mechanical stability, even when the semiconductor device package is dropped or receives an external impact, the semiconductor device 230 can be prevented from being damaged.

In addition, the semiconductor device package according to the embodiment may comprise a diffusion unit 220. The diffusion unit 220 may be disposed on the semiconductor device 230. The diffusion unit 220 may be disposed on the package body 210. The diffusion unit 220 may be supported by the package body 210. The diffusion unit 220 may be supported by the first sidewall 212 of the package body 210. The diffusion unit 220 may be disposed in the second cavity C2 surrounded by the second sidewall 213. The diffusion unit 220 may comprise a function of expanding a beam angle of light emitted from the semiconductor device 230. The diffusion unit 220 may comprise, for example, a microlens, a concavo-convex pattern, or the like.

The semiconductor device 230 according to the embodiment may be selected from a light emitting device including a light emitting diode device and a laser diode device. For example, the semiconductor device 230 may be a vertical cavity surface emitting laser (VCSEL) semiconductor device. The vertical cavity surface emitting laser (VCSEL) semiconductor device can emit beams in the upper direction at the upper surface. The vertical cavity surface emitting laser (VCSEL) semiconductor devices can emit beams upward in a beam angle of, for example, 15 degrees to 25 degrees. The vertical cavity surface emitting laser (VCSEL) semiconductor device may comprise a single light emitting aperture or multiple light emitting apertures that emit a circular beam. An example of the vertical cavity surface emitting laser (VCSEL) semiconductor device will be described later.

The package body 210 may comprise the support 211, a first sidewall 212 disposed on the support 211, and the second sidewall 213 disposed on the first sidewall 212.

The first sidewall 212 may be disposed at an edge region of an upper surface of the support 211. The first sidewall 212 may be disposed on an outer peripheral region of the upper surface of the support 211. The first sidewall 212 may protrude from the edge region of the upper surface of the support 211 to a first thickness t2. The first cavity C1 may be formed in a central region of the upper surface of the support 211 by the first sidewall 212. The first sidewall 212 may protrude upward from the upper surface of the support 211 to the first thickness t2 and may comprise a first upper surface of a first width w2.

The first width w2 of the first upper surface of the first sidewall 212 and a lower surface of the first sidewall 212 may be equal to each other. In this case, the first width w2 of the first upper surface of the first sidewall 212, which can support the diffusion unit 220, can be stably formed. The width w4 of the area of the first upper surface area of the first sidewall 212 that overlaps with the diffusion unit 220 in the vertical direction and supports the diffusion unit 220 is determined by the adhesive strength and the mechanical stability, and may be formed to a thickness of 200 micrometers or more. The width w4 of the area supporting the diffusion unit 220 may be about 18% to 22% of the width of the diffusion unit 220. If the width w4 of the area supporting the diffusion unit 220 is less than 18% of the width of the diffusion unit 220, the diffusion unit 220 may not be stably supported. When the width w4 of the area supporting the diffusion unit 220 is larger than 22% of the width of the diffusion unit 220, there is a disadvantage that the size of the diffusion unit 220 becomes excessively large, and the size of the semiconductor device package becomes large. The width w4 of the area supporting the diffusion unit 220 may be adjusted according to the bondability between the diffusion unit 220 and the package body 210. Alternatively, the first width w2 of the first upper surface of the first sidewall 212 may be formed to be smaller than the width of the lower surface of the first sidewall 212. The angle provided by an inner surface of the first sidewall 212 and the upper surface of the support 211 may be an obtuse angle greater than 90 degrees, and the degree of freedom in the process of forming the package body 210 can be improved. The inclination angle of the first sidewall 212 may be selectively determined in consideration of the size of the semiconductor device 230, the size of the diffusion unit 220, the processing conditions of the package body 210, and the like.

The second sidewall 213 may be disposed on the first sidewall 212, as shown in FIGS. 4 to 7. The second sidewall 213 may protrude upwardly from the first upper surface of the first sidewall 212 with a second thickness t3. The second sidewall 213 may be disposed in an edge region of the first upper surface of the first sidewall 212. The second sidewall 213 may protrude upward from the edge region of the first upper surface of the first sidewall 212 with the second thickness t3. The second cavity C2 surrounded by the second sidewall 213 may be formed.

The second sidewall 213 may comprise an inner surface formed in a plurality of stepped shapes, as shown in FIG. FIG. 7 is an enlarged view of the area of P shown in FIG. 6. The second sidewall 213 may have a plurality of stepped shapes increasing in width from the top to the bottom. For example, the second sidewall 213 may comprise a first layer 213a having a first thickness t31 and a first width w31, a second layer 213b having a second thickness t32 and a second width w32, and a third layer 213c having a third thickness t33 and a third width w33. A lower surface of the third layer 213c may be formed smaller than the first width w2 of the first upper surface of the first sidewall 212. The first width w31, the second width w32, and the third width w33 of the second sidewall 213 may be determined by the strength characteristics of the material forming the package body 210, mechanical working conditions, and the like.

For example, the first thickness t31, the second thickness t32, and the third thickness t33 of the second sidewall 213 each may be 130 micrometers to 170 micrometers. For example, the first width w31 of the second sidewall 213 may be about 150 micrometers to about 170 micrometers, the second width w32 may be about 100 micrometers to about 120 micrometers, and the third width w33 may be 50 micrometers to 70 micrometers.

In the embodiment explained with reference to FIG. 7, the inner surface of the second sidewall 213 is formed in a stepped shape of three layers, however, the inner surface of the second sidewall 213 may be formed in a stepped shape of two layers, or in a stepped shape of four or more layers.

The diffusion unit 220 may be supported by the first upper surface of the first sidewall 212. The diffusion unit 220 may be surrounded by the second sidewall 213. The diffusion unit 220 may be disposed in the second cavity C2 formed by the second sidewall 213. An edge region of the lower surface of the diffusion unit 220 may be supported by the first upper surface of the first sidewall 212. The thickness of the diffusion unit 220 may be the same as the second thickness t3 of the second sidewall 213. The thickness of the diffusion unit 220 may be smaller than the second thickness t3 of the second sidewall 213. Since the thickness of the diffusion unit 220 is equal to or smaller than the second thickness t3 of the second sidewall 213, the diffusion unit 220 can be protected by the second sidewall 213. That is, it is possible to prevent the diffusion unit 220 from being damaged even when the semiconductor device package according to the embodiment drops or receives an external impact.

The semiconductor device 230 may be disposed on the support 211. The semiconductor device 230 may be disposed on the upper surface of the support 211. The semiconductor device 230 may be disposed under the diffusion unit 220. The semiconductor device 230 may be disposed in a central region of the upper surface of the support 211 and may be disposed in the first cavity C1. The thickness of the semiconductor device 230 may be smaller than the first thickness t2 of the first sidewall 212. An upper surface of the semiconductor device 230 may be spaced apart from the lower surface of the diffusion unit 220.

An outer surface 211S of the support 211, an outer surface 212S of the first sidewall 212, and an outer surface 213S of the second sidewall 213 may be formed without a step. The outer surface 211S of the support 211, the outer surface 212S of the first sidewall 212, and the outer surface 213S of the second sidewall 213 are formed so as to form one plane. A distance d1 between the outer surfaces 211S of the support 211, a distance d2 between the outer surfaces 212S of the first sidewall 212, and a distance d3 between the outer surfaces 213S of the second sidewall 213 may be the same.

The semiconductor device package according to the embodiment may comprise a first adhesive layer 250 provided between the diffusion unit 220 and the second sidewall 213. The first adhesive layer 250 may be disposed between the second sidewall 213 and the side surface of the diffusion unit 220. The first adhesive layer 250 may be disposed between the inner surface of the second sidewall 213 provided in a plurality of stepped shapes and the side surface of the diffusion unit 220. The first adhesive layer 250 may be disposed between the inner surface of the first layer 213a of the second sidewall 213 and the diffusion unit 220. The first adhesive layer 250 may be disposed between the inner surface of the second layer 213b of the second sidewall 213 and the diffusion unit 220. The first adhesive layer 250 may be disposed between the inner surface of the third layer 213c of the second sidewall 213 and the diffusion unit 220. Since the inner surface of the second sidewall 213 is formed in a plurality of steps, the contact area between the first adhesive layer 250 and the diffusion unit 220, the first adhesive layer 250 being disposed between the second sidewall 213 and the diffusion unit 220, is increased so that mechanical stability and sufficient adhesive force can be provided. The first adhesive layer 250 may be disposed between the lower surface of the diffusion unit 220 and the first upper surface of the first sidewall 212.

The first adhesive layer 250 allows the diffusion unit 220 to be stably fixed in the second cavity C2. The first adhesive layer 250 allows the diffusion unit 220 to be stably disposed in the second sidewall 213. Accordingly, in the semiconductor device package according to the embodiment, the space formed by the diffusion unit 220 and the body 200 can be sealed by the first adhesive layer 250, and moisture or foreign matter can be effectively prevented from penetrating into the space where the semiconductor device 230 is disposed, and reliability can be improved.

For example, the first adhesive layer 250 may comprise an organic material. The first adhesive layer 250 may comprise an epoxy-based resin. The first adhesive layer 250 may comprise a silicone-based resin.

According to the embodiment, the support 211 may comprise a first support 211a and a second support 211b. The first support 211a and the second support 211b may be spaced apart from each other. The first support 211a and the second support 211b may be electrically insulated from each other. The semiconductor element 230 may be disposed on the first support 211a or the second support 211b.

The semiconductor device package according to the embodiment may comprise a second adhesive layer 260 disposed between the first support 211a and the second support 211b. The second adhesive layer 260 may electrically insulate the first support 211a and the second support 211b. In addition, the second adhesive layer 260 provides a function of physically and stably coupling the first support 211a and the second support 211b. The second adhesive layer 260 provides electrical insulation and adhesion between the first and second supports 211a and 211b. The package body 210 according to the embodiment may comprise a first package body 210a and a second package body 210b coupled by the second adhesive layer 260.

For example, the second adhesive layer 260 may comprise an organic material. The second adhesive layer 260 may comprise an epoxy-based resin. The second adhesive layer 260 may comprise a silicone-based resin.

The semiconductor device package according to the embodiment may further comprise a metal layer 240 provided between the semiconductor device 230 and the support 211. For example, the semiconductor device 230 may be electrically connected to the first support 211a by wire bonding through a wire 270. In addition, the semiconductor device 230 may be electrically connected to the second support 211b through die bonding. The metal layer 240 may be disposed between the semiconductor device 230 and the second support 211b. For example, the metal layer 240 may be provided in the die bonding region of the semiconductor device 230 and the second support 211b. The metal layer 240 can improve the adhesion between the semiconductor device 230, the die paste for die bonding, and the second support 211b. The metal layer 240 may be selected in consideration of the die paste material, the die bonding region material of the semiconductor device 130, and the like. For example, the metal layer 240 may be formed as a single layer or a multilayer including at least one of metals including gold (Au), aluminum (Al), copper (Cu), and silver (Ag). The metal layer 240 may be formed of a single metal or an alloy. For example, the metal layer 240 may be formed by a plating process or the like.

The metal layer 240 may provide a metal bond between the semiconductor device 230 and the support 211. Accordingly, according to the embodiment, heat dissipation characteristics in which heat generated in the semiconductor device 230 is transferred to the support 211 can be improved. Also, from an electrical point of view, the current injection characteristic to be applied to the semiconductor device 230 through the support 211 can be improved. For example, a thickness of the metal layer 240 may be in the range of 0.04 micrometers to 0.4 micrometers. The thickness of the metal layer 240 may be selectively changed according to the process of die bonding. For example, the thickness of the metal layer 240 may be 0.2 micrometers to 0.4 micrometers when eutectic bonding is applied. The thickness of the metal layer 240 may be 0.04 micrometers to 0.06 micrometers when pick and place bonding is applied.

According to the embodiment, as shown in FIG. 5, when viewed from the upper direction, the package body 210 may have a rectangular shape. An example of a method of manufacturing a semiconductor package according to an embodiment will be described later, but the outer surface of the package body 210 may be formed by a cutting process such as dicing. Accordingly, the outer surface of the package body 210 may be formed perpendicular to the upper surface of the support 211. That is, the outer surface 211S of the support 211, the outer surface 212S of the first sidewall 212, and the outer surface 213S of the second sidewall 213 may be arranged on the same plane without a step.

The package body 210 may be formed, for example, by mechanical processing by a tool such as a drill. Accordingly, a rounded inner side surface having a curvature that is not a straight line may be formed in a region where two adjacent sides of the first sidewall 212 meet. In other words, the side area of the first cavity C1 formed by the first sidewall 212 may be formed in a linear shape, and the corner area between two neighboring sides may be formed into a shape having a curvature. Also, an inner surface of a rounded shape having a curvature that is not a straight line may be formed in an area where two adjacent sides of the second sidewall 213 meet. In other words, the side area of the second cavity C2 formed by the second sidewall 213 is formed in a linear shape, and the corner area between two neighboring sides may be formed into a shape having a curvature.

The semiconductor device package according to the embodiment described above is based on the case where the semiconductor device 230 is connected to the second support 211b by die bonding and is connected to the first support 211a by wire bonding. However, the electrical connection between the semiconductor device 230 and the support 211 can be variously modified. For example, the semiconductor device 230 may be electrically connected to the support 211 by a flip chip bonding method. Also, the semiconductor device 230 may be electrically connected to the first support 211a and the second support 211b by a wire bonding method.

According to the embodiment, the first support 211a and the second support 211b may be arranged to receive power from the outside. As an example, a circuit board for power supply may be disposed under the support 211. The semiconductor device package according to the embodiment can be directly mounted on the circuit board.

In addition, the semiconductor device package according to the embodiment may further comprise an insulation layer provided on the package body 210 to prevent electrical short due to external foreign matter. As an example, a photo solder resist (PSR) may be disposed on the package body 210. The photo solder resist (PSR) may be disposed on the upper surface of the second sidewall 213 of the package body 210. The photo solder resist (PSR) may be formed on the uppermost surface of the package body 210 and may be formed in an area where the diffusion unit 220 is not disposed. Also, the photo solder resist (PSR) may be formed on the first adhesive layer 250 exposed by the diffusion unit 220. The photo solder resist (PSR) may also be formed on the second adhesive layer 260 exposed by the diffusion unit 220.

As described above, according to the semiconductor device package of the embodiment, since the package body can be provided with a metal having excellent heat dissipation characteristics, the heat dissipation effect can be improved and the reliability can be improved while realizing a small size.

In addition, according to the semiconductor device package of the embodiment, since the package body is integrally formed of a metal material to provide mechanical stability, even when the semiconductor device package is dropped or receives an external impact, the semiconductor device and the diffusion unit, which are disposed in the package body, are prevented from being damaged, and the reliability can be improved.

Meanwhile, according to the semiconductor device package of the embodiment, the semiconductor device 130 may be formed of a vertical cavity surface emitting laser (VCSEL) semiconductor device. The vertical cavity surface emitting laser (VCSEL) semiconductor devices may comprise a single light emitting aperture or multiple light emitting apertures that emit a circular beam in the upper direction at the top surface. When a vertical cavity surface emitting laser (VCSEL) semiconductor device has a single light emitting aperture, the width and length of the semiconductor device each may be, for example, 100 micrometers to 150 micrometers. When a high output semiconductor device is required, a vertical cavity surface emitting laser (VCSEL) semiconductor device including a plurality of light emitting apertures may be used, the size of the semiconductor device may be increased to correspond to an increase in the number of light emitting apertures. Also, as the size of the semiconductor device increases, the size of the diffusion unit needs to be increased.

However, as described with reference to FIGS. 2 and 5, the side area of the inner side surface of the package body according to the embodiment are formed in a linear shape, but the edge area of the inner side is formed into a round shape having a curvature. At this time, when the package body is limited to a certain size or less, the size of the diffusion unit may be limited by the curvature shape of the corner area of the inner side of the package body. That is, although a space is formed between the side area of the inner side surface of the package body and the side surface of the diffusion unit, the limitation that the size of the diffusion unit can be increased only to the extent that the edge area of the diffusion unit and the edge area of the inner side surface of the package body meet each other.

In order to solve this problem, it is possible to increase the size of the diffusion unit to such an extent that no space is formed between the side area of the inner side surface of the package body and the side area of the diffusion unit by forming curvature at the edge area of the diffusion unit. However, in the case of manufacturing the diffusion unit as described above, there is a disadvantage that the process speed and yield may be lowered because the edge area of the diffusion unit has to be further processed so as to have a curvature in accordance with the curvature of the inner side of the package body.

With this in mind, a semiconductor device package according to an embodiment shown in FIGS. 8 to 10 can be suggested.

Next, another example of the semiconductor device package according to the embodiment will be described with reference to FIGS. 8 to 10.

FIG. 8 is an exploded perspective view showing another example of a semiconductor device package according to the embodiment of the present invention. FIG. 9 is a plan view of the semiconductor device package shown in FIG. 8, and FIG. 10 is a cross-sectional view of the semiconductor device package shown in FIG. 9. In describing the semiconductor device package according to the embodiment with reference to FIGS. 8 to 10, a description of elements overlapping with those described with reference to FIGS. 1 to 7 may be omitted.

A semiconductor device package according to the embodiment may comprise a package body 310 and a semiconductor device 330 disposed on the package body 310, as shown in FIGS. 8 to 10. The package body 310 may comprise a support 311, a first sidewall 312, and a second sidewall 313. The semiconductor device 330 may be disposed on the support 311 as an example.

According to the embodiment, the support 311, the first sidewall 312, and the second sidewall 313 may be formed of the same material. The support 311, the first sidewall 312, and the second sidewall 313 may be integrally formed. For example, the package body 310 may comprise a first cavity C1 defined by the first sidewall 312 and a second cavity C2 defined by the second sidewall 313. The first cavity C1 and the second cavity C2 may be formed by mechanical processing using a tool such as a drill. Also, the second cavity C2 may be referred to as a recessed region.

According to the embodiment, the package body 310 may be formed of a metal. The package body 310 may comprise at least one of metals including aluminum (Al), copper (Cu), gold (Au), silver (Ag). The package body 310 may be formed of a single metal or an alloy.

According to the semiconductor device package of the embodiment, since the package body 310 is formed of a metal having excellent heat dissipation characteristics, the heat dissipation effect can be improved. The package body 310 can efficiently dissipate heat generated from the semiconductor device 330 to the outside. In addition, since the semiconductor device 330 is disposed in the package body 310, which is integrally formed of a metal material and has mechanical stability, even when the semiconductor device package is dropped or impacted from the outside, the semiconductor device package can be prevented from being damaged.

In addition, the semiconductor device package according to the embodiment may comprise a diffusion unit 320. The diffusion unit 320 may be disposed on the semiconductor device 330. The diffusion unit 320 may be disposed on the package body 310. The diffusion unit 320 may be supported by the package body 310. The diffusion unit 320 may be supported by the first sidewall 312 of the package body 310. The diffusion unit 320 may be disposed in the second cavity C2 defined by the second sidewall 313. The diffusion unit 320 may comprise a function of expanding a beam angle of light emitted from the semiconductor device 330. The diffusion unit 320 may comprise, for example, a microlens, a concavo-convex pattern, or the like.

The semiconductor device 330 according to the embodiment may be selected from a light emitting device including a light emitting diode device and a laser diode device. For example, the semiconductor device 330 may be a vertical cavity surface emitting laser (VCSEL) semiconductor device. The vertical cavity surface emitting laser (VCSEL) semiconductor devices can emit beams in the upper direction at the upper surface. The vertical cavity surface emitting laser (VCSEL) semiconductor devices can emit beams upward in a beam angle of, for example, 15 degrees to 25 degrees. The vertical cavity surface emitting laser (VCSEL) semiconductor devices may comprise a single light emitting aperture or multiple light emitting apertures that emit a circular beam. An example of the vertical cavity surface emitting laser (VCSEL) semiconductor device will be described later.

The package body 310 may comprise the support 311, the first sidewall 312 disposed on the support 311, and the second sidewall 313 disposed on the first sidewall 312.

The first sidewall 312 may be disposed at an edge region of an upper surface of the support 311. The first sidewall 312 may be disposed on an outer peripheral region of the upper surface of the support 311. The first sidewall 312 may protrude from the edge region of the upper surface of the support 311 to a first thickness t2. The first cavity C1 may be formed in a central region of the upper surface of the support 311 by the first sidewall 312. The first sidewall 312 may protrude upward from the upper surface of the support 311 to the first thickness t2 and may comprise a first upper surface of a first width w2.

The first width w2 of the first upper surface of the first sidewall 312 and a lower surface of the first sidewall 312 may be equal to each other. In this case, the first width w2 of the first upper surface of the first sidewall 312, which can support the diffusion unit 320, can be stably formed. The width w4 of the area of the first upper surface area of the first sidewall 312 that overlaps with the diffusion unit 320 in the vertical direction and supports the diffusion unit 320 may be determined by the adhesive force, and mechanical stability, and may be formed with 200 micrometers or more. The width w4 of the area supporting the diffusion unit 320 may be about 18% to 22% of the width of the diffusion unit 320. If the width w4 of the area supporting the diffusion unit 320 is less than 18% of the width of the diffusion unit 320, the diffusion unit 320 may not be stably supported. If the width w4 of the area supporting the diffusion unit 320 is larger than 22% of the width of the diffusion unit 320, there is a disadvantage that the size of the diffusion unit 320 becomes excessively large in size, and the size of the semiconductor device package becomes large.

The width w4 of the area supporting the diffusion unit 320 may be adjusted according to the bondability between the diffusion unit 320 and the package body 310. Alternatively, the first width w2 of the first upper surface of the first sidewall 312 may be smaller than the width of the lower surface of the first sidewall 312. The angle provided between an inner surface of the first sidewall 312 and the upper surface of the support 311 may be formed at an obtuse angle greater than 90 degrees, and the degree of freedom in the process of forming the package body 310 can be improved. The inclination angle of the first sidewall 312 may be selectively determined in consideration of the size of the semiconductor device 330, the size of the diffusion unit 320, the processing conditions of the package body 310, and the like.

The second sidewall 313 may be formed on the first sidewall 312. The second sidewall 313 may protrude from the first upper surface of the first sidewall 312 with a second thickness t3. The second sidewall 313 may be disposed in an edge region of the first upper surface of the first sidewall 312. The second sidewall 313 may protrude upward from the edge region of the first upper surface of the first sidewall 312 with the second thickness t3. The second cavity C2 defined by the second sidewall 313 may be formed. The second sidewall 313 may comprise a second upper surface of a second width w3. A lower surface of the second sidewall 313 may be formed wider than the second width w3. The lower surface of the second sidewall 313 may be formed smaller than the first width w2 of the first upper surface of the first sidewall 312. The second width w3 of the second sidewall 313 may be, for example, about 50 micrometers to about 250 micrometers, in consideration of strength characteristics of the material of the package body 310, mechanical working conditions, and the like. For example, the second width w3 of the second sidewall 313 may be about one-third of the first width w2 of the first sidewall 312.

According to the embodiment, as shown in FIGS. 8 and 9, the second sidewall 313 may comprise a first guide 313a, a second guide 313b, a third guide 313c, and a fourth guide 313d. The first guide 313a, the second guide 313b, the third guide 313c, and the fourth guide 313d may be disposed on the first sidewall 312. The first guide 313a and the third guide 313c may be disposed to face each other. The second guide 313b and the fourth guide 313d may be disposed to face each other.

As shown in FIG. 9, the first sidewall 312 may be formed in a rectangular shape when viewed from above. The first sidewall 312 may comprise a first corner region X1, a second corner region X2, a third corner region X3 and a fourth corner region X4. The second sidewall 313 may not be formed at the first corner region X1, the second corner region X2, the third corner region X3, and the fourth corner region X4. The second sidewall 313 may be disposed on a side between neighboring corner regions of the first sidewall 312 and may not be disposed at corner regions.

For example, the first guide 313a may be disposed between the first corner region X1 and the fourth corner region X4. The first guide 313a may be disposed on the upper surface of the first sidewall 312, which is disposed between the first corner region X1 and the fourth corner region X4. The first corner region X1 and the fourth corner region X4 may be disposed at both ends of one side of the first sidewall 312.

The second guide 313b may be disposed between the first corner region X1 and the second corner region X2. The second guide 313b may be disposed on the upper surface of the first sidewall 312, which is disposed between the first corner region X1 and the second corner region X2. The first corner region X1 and the second corner region X2 may be disposed at both ends of one side of the first sidewall 312.

The third guide 313c may be disposed between the second corner region X2 and the third corner region X3. The third guide 313c may be disposed on the upper surface of the first sidewall 312, which is disposed between the second corner region X2 and the third corner region X3. The second corner region X2 and the third corner region X3 may be disposed at both ends of one side of the first sidewall 312.

The fourth guide 313d may be disposed between the third corner region X3 and the fourth corner region X4. The fourth guide 313d may be disposed on the upper surface of the first sidewall 312, which is disposed between the third corner region X3 and the fourth corner region X4. The third corner region X3 and the fourth corner region X4 may be disposed at both ends of one side of the first sidewall 312.

The diffusion unit 320 may be supported by the first upper surface of the first sidewall 312. The diffusion unit 320 may be surrounded by the second sidewall 313. The diffusion unit 320 may be disposed in the second cavity C2 defined by the second sidewall 313. An edge region of the lower surface of the diffusion unit 320 may be supported by the first upper surface of the first sidewall 312.

The diffusion unit 320 may be coupled to an inner side surface of the second sidewall 313. The diffusion unit 320 may extend in the direction of a corner region provided at both ends adjacent to the inner side surface of the second sidewall 313. The diffusion unit 320 may be disposed so as to be surrounded by the first guide 313a, the second guide 313b, the third guide 313c, and the fourth guide 313d.

The diffusion unit 320 may be coupled to the inner side surface of the first guide 313a. The diffusion unit 320 may extend from the inner side surface of the first guide 313a toward both the first corner region X1 and the fourth corner region X4.

The diffusion unit 320 may be coupled to the inner side surface of the second guide 313b. The diffusion unit 320 may extend from the inner side surface of the second guide 313b toward both the first corner region X1 and the second corner region X2.

The diffusion unit 320 may be coupled to the inner side surface of the third guide 313c. The diffusion unit 320 may extend from the inner side surface of the third guide 313c toward both the second corner region X2 and the third corner region X3.

The diffusion unit 320 may be coupled to the inner side surface of the fourth guide 313d. The diffusion unit 320 may extend from the inner side surface of the fourth guide 313d toward both the first corner region X1 and the third corner region X3.

According to the embodiment, when the diffusion unit 320 is coupled to the first sidewall 312 and the second sidewall 313, the diffusion unit 320 can be extended without being restricted by the second sidewall 313 and be formed in the upper edge corner region of the first sidewall 312. Accordingly, even when the size of the semiconductor device 330 is increased, the degree of freedom of the design can be increased such that the size of the diffusion unit 320 can be increased.

The thickness of the diffusion unit 320 may be the same as the second thickness t3 of the second sidewall 313. Also, the thickness of the diffusion unit 320 may be smaller than the second thickness t3 of the second sidewall 313. Since the thickness of the diffusion unit 320 is equal to or smaller than the second thickness t3 of the second sidewall 313, the diffusion unit 320 can be protected by the second sidewall 313. That is, it is possible to prevent the diffusion unit 320 from being damaged even when the semiconductor device package according to the embodiment drops or receives an external impact.

The semiconductor device 330 may be disposed on the support 311. The semiconductor device 330 may be disposed on the upper surface of the support 311. The semiconductor device 330 may be disposed under the diffusion unit 320. The semiconductor element 330 may be disposed in a central region of the upper surface of the support 311 and may be disposed in the first cavity C1. A thickness of the semiconductor device 330 may be smaller than the first thickness t2 of the first sidewall 312. An upper surface of the semiconductor device 330 may be spaced apart from the lower surface of the diffusion unit 320.

An outer surface 311S of the support 311, an outer surface 312S of the first sidewall 312, and an outer surface 313S of the second sidewall 313 may be formed without a step. The outer surface 311S of the support 311, the outer surface 312S of the first sidewall 312, and the outer surface 313S of the second sidewall 313 may be formed so as to form one plane without a step each other. A distance d1 between the outer surfaces 311S of the support 311, a distance d2 between the outer surfaces 312S of the first sidewall 312, and a distance d3 between the outer surfaces 313S of the second sidewall 313 may be the same.

The semiconductor device package according to the embodiment may comprise a first adhesive layer 350 disposed between the diffusion unit 320 and the second sidewall 313. The first adhesive layer 350 may be disposed between the second sidewall 313 and a side surface of the diffusion unit 320. The first adhesive layer 350 may be disposed between an inner surface of the first guide 313a and a side surface of the diffusion unit 320 facing the first guide 313a. The first adhesive layer 350 may be disposed between an inner surface of the second guide 313b and a side surface of the diffusion unit 320 facing the second guide 313b. The first adhesive layer 350 may be disposed between an inner surface of the third guide 313c and a side surface of the diffusion unit 320 facing the third guide 313c. The first adhesive layer 350 may be disposed between an inner surface of the fourth guide 313d and a side surface of the diffusion unit 320 facing the fourth guide 313d. Also, the first adhesive layer 350 may be disposed between the lower surface of the diffusion unit 320 and the first upper surface of the first sidewall 312.

The first adhesive layer 350 allows the diffusion unit 320 to be stably fixed in the second cavity C2. The first adhesive layer 350 allows the diffusion unit 320 to be stably disposed on the second sidewall 313. Accordingly, in the semiconductor device package according to the embodiment, the space formed by the diffusion unit 320 and the body 300 can be sealed by the first adhesive layer 350, and moisture or foreign matter can be effectively prevented from penetrating into the space where the semiconductor device 330 is disposed, and reliability can be improved.

For example, the first adhesive layer 350 may comprise an organic material. The first adhesive layer 350 may comprise an epoxy-based resin. The first adhesive layer 350 may comprise a silicone-based resin.

According to the embodiment, the support 311 may comprise a first support 311a and a second support 311b. The first support 311a and the second support 311b may be spaced apart from each other. The first support 311a and the second support 311b may be electrically insulated from each other. The semiconductor device 330 may be disposed on the first support 311a or the second support 311b.

The semiconductor device package according to the embodiment may comprise a second adhesive layer 360 disposed between the first support 311a and the second support 311b. The second adhesive layer 360 may electrically insulate the first support 311a and the second support 311b. In addition, the second adhesive layer 360 provides a function of physically and stably coupling the first support 311a and the second support 311b. The second adhesive layer 360 provides electrical insulation and adhesion between the first support 311a and the second support 311b. The package body 310 according to the embodiment may comprise a first package body 310a and a second package body 310b coupled by the second adhesive layer 360.

For example, the second adhesive layer 360 may comprise an organic material. The second adhesive layer 360 may comprise an epoxy-based resin. The second adhesive layer 360 may comprise a silicone-based resin.

The semiconductor device package according to the embodiment may further comprise a metal layer 340 provided between the semiconductor device 330 and the support 311. For example, the semiconductor device 330 may be electrically connected to the first support 311a by wire bonding through a wire 370. Also, the semiconductor device 330 may be electrically connected to the second support 311b through die bonding. The metal layer 340 may be disposed between the semiconductor device 330 and the second support 311b. For example, the metal layer 340 may be provided in the die bonding region between the semiconductor device 330 and the second support 311b. The metal layer 340 may improve adhesion between the semiconductor device 330, a die paste for die bonding, and the second support 311b. The metal layer 340 may be selected in consideration of the die paste material, the die bonding region material of the semiconductor device 330, and the like. For example, the metal layer 340 may be formed as a single layer or a multilayer including at least one of metals including gold (Au), aluminum (Al), copper (Cu), and silver (Ag). The metal layer 340 may be formed of a single metal or an alloy. For example, the metal layer 340 may be formed by a plating process or the like.

The metal layer 340 may provide a metal bond between the semiconductor device 330 and the support 311. Accordingly, according to the embodiment, heat dissipation characteristics in which heat generated in the semiconductor device 330 is transferred to the support 311 can be improved. Also, from an electrical point of view, the current injection characteristic to be applied to the semiconductor device 330 through the support 311 can be improved. For example, a thickness of the metal layer 340 may be in the range of 0.04 micrometers to 0.4 micrometers. The thickness of the metal layer 340 may be selectively changed according to the die bonding process. For example, the thickness of the metal layer 340 may be 0.2 micrometers to 0.4 micrometers when eutectic bonding is applied. The thickness of the metal layer 340 may be 0.04 micrometers to 0.06 micrometers when pick and place bonding is applied.

According to the embodiment, as shown in FIG. 9, when viewed from the upper direction, the package body 310 may be formed in a rectangular shape. An example of a method of manufacturing a semiconductor package according to an embodiment will be described later, but the outer surface of the package body 310 may be formed by a cutting process such as dicing. Accordingly, the outer surface of the package body 310 may be formed perpendicular to the upper surface of the support 311. That is, the outer surface 311S of the support 311, the outer surface 312S of the first sidewall 312, and the outer surface 313S of the second sidewall 313 may be arranged on the same plane without a step each other.

The package body 310 may be formed, for example, by mechanical processing by a tool such as a drill. Accordingly, a rounded inner side surface having a curvature that is not a straight line may be formed in a region where two adjacent sides of the first sidewall 312 meet. In other words, the side area of the first cavity C1 formed by the first sidewall 312 is formed in a linear shape, and the corner area between two neighboring sides may be formed into a shape having a curvature. That is, the first corner region X1, the second corner region X2, the third corner region X3, and the fourth corner region X4 of the first sidewall 312 may be formed as inner sides having a curvature.

The semiconductor device package according to the embodiment described above is based on the case where the semiconductor device 330 is connected to the second support 311b by die bonding and is connected to the first support 311a by wire bonding. However, the electrical connection between the semiconductor device 330 and the support 311 can be variously modified. For example, the semiconductor device 330 may be electrically connected to the support 311 by a flip chip bonding method. Also, the semiconductor device 330 may be electrically connected to the first support 311a and the second support 311b by a wire bonding method.

According to the embodiment, the first support 311a and the second support 311b may be arranged to receive power from the outside. As an example, a circuit board for power supply may be disposed under the support 311. The semiconductor device package according to the embodiment may be directly mounted on the circuit board.

In addition, the semiconductor device package according to the embodiment may further comprise an insulating layer provided on the package body 310 to prevent electrical short caused by external foreign matter. For example, a photo solder resist (PSR) may be disposed on the package body 310. The photo solder resist (PSR) may be disposed on the upper surface of the second sidewall 313 of the package body 310. The photo solder resist (PSR) may be formed on the uppermost surface of the package body 310 and may be formed in an area where the diffusion unit 320 is not disposed. The photo solder resist (PSR) may also be formed on the first adhesive layer 350 exposed by the diffusion unit 320. The photo solder resist (PSR) may also be formed on the second adhesive layer 360 exposed by the diffusion unit 320.

Meanwhile, the semiconductor device package according to the embodiment, with reference to FIGS. 8 to 10, has been described based on the case where the inner surface of the second sidewall 313 is formed as a flat surface. However, as described with reference to FIGS. 4 to 7, the inner surface of the second sidewall 313 may be formed in a plurality of stepped shapes. That is, at least one inner surface of the first guide 313a, the second guide 313b, the third guide 313c, and the fourth guide 313d may be formed in a plurality of stepped shapes. When the inner surface of the second sidewall 313 is formed in a plurality of stepped shapes, it is possible to provide a sufficient space that the first adhesive layer 350 can be disposed between the diffusion unit 320 and the second sidewall 313. Accordingly, the coupling force between the diffusion unit 320 and the package body 310 can be further improved.

Also, according to the embodiment, the thickness of the diffusion unit 320 may be formed to be thicker than the second thickness t3 of the second sidewall 313. When the package body 310 is formed as described above, the degree of the freedom of the design can be increased such that the thickness of the package body 310 may be reduced, and the thickness of the diffusion unit 320 may be selected to be large.

As described above, according to the semiconductor device package of the embodiment, since the package body can be formed of a metal having excellent heat dissipation characteristics, the heat dissipation effect can be improved and the reliability can be improved while realizing a small size.

In addition, according to the semiconductor device package of the embodiment, since the package body is integrally formed of a metal material to provide mechanical stability, even when the semiconductor device package is dropped or receive an external impact, the semiconductor device and the diffusion unit, which are disposed in the package body, are prevented from being damaged, and the reliability can be improved.

In addition, according to the semiconductor device package of the embodiment, when the diffusion unit is coupled with the first sidewall and the second sidewall, the diffusion unit in the upper surface corner region of the first sidewall can be extended without being restricted by the second sidewall. Accordingly, even when the size of the semiconductor device is increased to realize a high output, it is possible to increase the degree of freedom of design that can increase the size of the diffusion unit while realizing a small size of the package body.

Next, with reference to FIGS. 11 to 13, another example of the semiconductor device package according to the embodiment, which is capable of improving the bonding force between the diffusion unit and the package body while realizing a compact size of the package body, will be described.

FIG. 11 is an exploded perspective view showing another example of the semiconductor device package according to the embodiment of the present invention, FIG. 12 is a plan view of the semiconductor device package shown in FIG. 11, FIG. 13 is a cross-sectional view taken along line D-D of the semiconductor device package shown in FIG. 12. In describing the semiconductor device package according to the embodiment, with reference to FIGS. 11 to 13, description of elements overlapping with those described with reference to FIGS. 1 to 10 may be omitted.

The semiconductor device package according to the embodiment may comprise a package body 410 and a semiconductor device 430 disposed on the package body 410, as shown in FIGS. 11 to 13. The package body 410 may comprise a support 411, a first sidewall 412, and a second sidewall 413. The semiconductor device 430 may be disposed on the support 411 as an example.

According to the embodiment, the support 411, the first sidewall 412, and the second sidewall 413 may be formed of the same material. In addition, the support 411, the first sidewall 412, and the second sidewall 413 may be integrally formed. For example, the package body 410 may comprise a first cavity C1 defined by the first sidewall 412 and a second cavity C2 defined by the second sidewall 413. The first cavity C1 and the second cavity C2 may be formed by mechanical processing using a tool such as a drill. Also, the second cavity C2 may be referred to as a recess region.

According to the embodiment, the package body 410 may be formed of metal. The package body 410 may comprise at least one of metals including aluminum (Al), copper (Cu), gold (Au), silver (Ag). The package body 410 may be formed of a single metal or an alloy.

According to the semiconductor device package of the embodiment, since the package body 410 is formed of a metal having excellent heat dissipation characteristics, the heat dissipation effect can be improved. The package body 410 can efficiently dissipate the heat generated from the semiconductor device 430 to the outside. In addition, when the semiconductor device 430 is disposed in the package body 410, which is integrally formed of a metal material and has mechanical stability, even when the semiconductor device package is dropped or impacted from the outside, the semiconductor device package can be prevented from being damaged.

In addition, the semiconductor device package according to the embodiment may comprise a diffusion unit 420. The diffusion unit 420 may be disposed on the semiconductor device 430. The diffusion unit 420 may be disposed on the package body 410. The diffusion unit 420 may be supported by the package body 410. The diffusion unit 420 may be supported by the first sidewall 412 of the package body 410. The diffusion unit 420 may be disposed in the second cavity C2 defined by the second sidewall 413. The diffusion unit 420 may comprise a function of expanding a beam angle of light emitted from the semiconductor device 430. The diffusion unit 420 may comprise, for example, a microlens, a concavo-convex pattern, or the like.

The semiconductor device 430 according to the embodiment may be selected from a light emitting device including a light emitting diode device and a laser diode device. For example, the semiconductor device 430 may be a vertical cavity surface emitting laser (VCSEL) semiconductor device. The vertical cavity surface emitting laser (VCSEL) semiconductor devices can emit beams in the upper direction at the upper surface. The vertical cavity surface emitting laser (VCSEL) semiconductor devices can emit beams upward in a beam angle of, for example, 15 degrees to 25 degrees. The vertical cavity surface emitting laser (VCSEL) semiconductor devices may comprise a single light emitting aperture or multiple light emitting apertures that emit a circular beam. An example of the vertical cavity surface emitting laser (VCSEL) semiconductor device will be described later.

The package body 410 may comprise the support 411, the first sidewall 412 disposed on the support 411, and the second sidewall 413 disposed on the first sidewall 412.

The first sidewall 412 may be disposed on an edge region of an upper surface of the support 411. The first sidewall 412 may be disposed on an outer peripheral region of the upper surface of the support 411. The first sidewall 412 may protrude from the edge region of the upper surface of the support 411 to a first thickness t2. The first cavity C1 may be formed in a central region of the upper surface of the support 411 by the first sidewall 412. The first sidewall 412 may protrude upward from the upper surface of the support 411 to the first thickness t2 and may comprise a first upper surface of a first width w2.

The first width w2 of the first upper surface of the first sidewall 412 and a lower surface of the first sidewall 412 may be equal to each other. In this case, the first width w2 of the first upper surface of the first sidewall 412, which can support the diffusion unit 420, can be stably formed. The width w4 of the area of the first upper surface area of the first sidewall 412 that overlaps with the diffusion unit 420 in the vertical direction and supports the diffusion unit 420 may be determined by the adhesive force, and mechanical stability, and may be formed with 200 micrometers or more. The width w4 of the area supporting the diffusion unit 420 may be about 18% to about 22% of the width of the diffusion unit 420. If the width w4 of the area supporting the diffusion unit 420 is less than 18% of the width of the diffusion unit 420, the diffusion unit 420 may not be stably supported. If the width w4 of the area supporting the diffusion unit 420 is larger than 22% of the width of the diffusion unit 420, there is a disadvantage that the size of the diffusion unit 420 becomes excessively large in size, and the size of the semiconductor device package becomes large. The width w4 of the area supporting the diffusion unit 420 may be adjusted according to the bondability between the diffusion unit 420 and the package body 410. Alternatively, the first width w2 of the first upper surface of the first sidewall 412 may be smaller than the width of the lower surface of the first sidewall 412. The angle provided between an inner surface of the first sidewall 412 and the upper surface of the support 411 may be formed at an obtuse angle greater than 90 degrees, and the degree of freedom in the process of forming the package body 410 can be improved. The inclination angle of the first sidewall 412 may be selectively determined in consideration of the size of the semiconductor device 430, the size of the diffusion unit 420, the processing conditions of the package body 410, and the like.

The second sidewall 413 may be disposed on the first sidewall 412. The second sidewall 413 may protrude from the first upper surface of the first sidewall 412 with a second thickness t3. The second sidewall 413 may be disposed in an edge region of the first upper surface of the first sidewall 412. The second sidewall 413 may protrude upward from the edge region of the first upper surface of the first sidewall 412 with the second thickness t3. The second cavity C2 defined by the second sidewall 413 may be formed. The second sidewall 413 may comprise a second upper surface of a second width w3. A lower surface of the second sidewall 413 may be wider than the second width w3. The lower surface of the second sidewall 413 may be formed smaller than the first width w2 of the first upper surface of the first sidewall 412. The second width w3 of the second sidewall 413 may be, for example, 50 micrometers to 250 micrometers in consideration of strength characteristics of the material of the package body 410, mechanical working conditions, and the like.

According to the embodiment, as shown in FIGS. 11 and 12, the second sidewall 413 may comprise a first guide 413a, a second guide 413b, a third guide 413c, and a fourth guide 413d. The first guide 413a, the second guide 413b, the third guide 413c, and the fourth guide 413d may be disposed on the first sidewall 412. The first guide 413a and the third guide 413c may be disposed to face each other. The second guide 413b and the fourth guide 413d may be disposed to face each other.

As shown in FIG. 12, the first sidewall 412 may be formed in a rectangular shape, for example, when viewed from above. The first sidewall 412 may comprise a first corner region X1, a second corner region X2, a third corner region X3, and a fourth corner region X4. The second sidewall 413 may not be formed in the first corner region X1, the second corner region X2, the third corner region X3, and the fourth corner region X4. The second sidewall 413 may be disposed between neighboring corner region of the first sidewall 412 and may not be disposed at corner regions.

For example, the first guide 413a may be disposed between the first corner region X1 and the fourth corner region X4. The first guide 413a may be disposed on the upper surface of the first sidewall 412, which is disposed between the first corner region X1 and the fourth corner region X4. The first corner region X1 and the fourth corner region X4 may be disposed at both ends of one side of the first sidewall 412.

The second guide 413b may be disposed between the first corner region X1 and the second corner region X2. The second guide 413b may be disposed on the upper surface of the first sidewall 412, which is disposed between the first corner region X1 and the second corner region X2. The first corner region X1 and the second corner region X2 may be disposed at both ends of one side of the first sidewall 412.

The third guide 413c may be disposed between the second corner region X2 and the third corner region X3. The third guide 413c may be disposed on the upper surface of the first sidewall 412, which is disposed between the second corner region X2 and the third corner region X3. The second corner region X2 and the third corner region X3 may be disposed at both ends of one side of the first sidewall 412.

The fourth guide 413d may be disposed between the third corner region X3 and the fourth corner region X4. The fourth guide 413d may be disposed on the upper surface of the first sidewall 412, which is disposed between the third corner region X3 and the fourth corner region X4. The third corner region X3 and the fourth corner region X4 may be disposed at both ends of one side of the first sidewall 412.

The diffusion unit 420 may be supported by the first upper surface of the first sidewall 412. The diffusion unit 420 may be surrounded by the second sidewall 413. The diffusion unit 420 may be disposed in the second cavity C2 defined by the second sidewall 413. An edge region of the lower surface of the diffusion unit 420 may be supported by the first upper surface of the first sidewall 412.

The diffusion unit 420 may be coupled to an inner side surface of the second sidewall 413. The diffusion unit 420 may extend in the direction of a corner region provided at both ends adjacent to the inner side surface of the second sidewall 413. The diffusion unit 420 may be disposed so as to be surrounded by the first guide 413a, the second guide 413b, the third guide 413c, and the fourth guide 413d.

The diffusion unit 420 may be coupled to the inner side surface of the first guide 413a. The diffusion unit 420 may extend from the inner side surface of the first guide 413a toward both the first corner region X1 and the fourth corner region X4.

The diffusion unit 420 may be coupled to the inner side surface of the second guide 413b. The diffusion unit 420 may extend from the inner side surface of the second guide 413b toward both the first corner region X1 and the second corner region X2.

The diffusion unit 420 may be coupled to the inner side surface of the third guide 413c. The diffusion unit 420 may extend from the inner side surface of the third guide 413c toward the second corner region X2 and the third corner region X3.

The diffusion unit 420 may be coupled to the inner side surface of the fourth guide 413d. The diffusion unit 420 may extend from the inner side surface of the fourth guide 413d toward the first corner region X1 and the third corner region X3.

According to the embodiment, when the diffusion unit 420 is coupled to the first sidewall 412 and the second sidewall 413, the diffusion unit 420 can be extended without being restricted by the second sidewall 413 and be formed in the upper edge corner region of the first sidewall 413. Accordingly, even when the size of the semiconductor device 430 is increased, the degree of freedom of the design can be increased such that the size of the diffusion unit 420 can be increased.

The thickness of the diffusion unit 420 may be the same as the second thickness t3 of the second sidewall 413. The thickness of the diffusion unit 420 may be smaller than the second thickness t3 of the second sidewall 413. Since the thickness of the diffusion unit 420 is equal to or smaller than the second thickness t3 of the second sidewall 413, the diffusion unit 420 can be protected by the second sidewall 413. That is, it is possible to prevent the diffusion unit 420 from being damaged even when the semiconductor device package according to the embodiment drops or receives an external impact.

The semiconductor device 430 may be disposed on the support 411. The semiconductor device 430 may be disposed on the upper surface of the support 411. The semiconductor device 430 may be disposed under the diffusion unit 420. The semiconductor device 430 may be disposed in a central region of the upper surface of the support 411 and may be disposed in the first cavity C1. A thickness of the semiconductor device 430 may be smaller than the first thickness t2 of the first sidewall 412. An upper surface of the semiconductor device 430 may be spaced apart from the lower surface of the diffusion unit 420.

An outer surface 411S of the support 411, an outer surface 412S of the first sidewall 412, and an outer surface 413S of the second sidewall 413 may be formed without a step. The outer surface 411S of the support 411, the outer surface 412S of the first sidewall 412, and the outer surface 413S of the second sidewall 413 may be formed so as to form one plane without a step each other. A distance d1 between the outer surfaces 411S of the support 411, a distance d2 between the outer surfaces 412S of the first sidewall 412, and a distance d3 between the outer side surfaces 413S of the second sidewall 413 may be the same.

The semiconductor device package according to the embodiment may comprise a first adhesive layer 450 disposed between the diffusion unit 420 and the second sidewall 413. The first adhesive layer 450 may be disposed between the second sidewall 413 and the side surface of the diffusion unit 420. The first adhesive layer 450 may be disposed between an inner surface of the first guide 413a and a side surface of the diffusion unit 420 facing the first guide 413a. The first adhesive layer 450 may be disposed between an inner surface of the second guide 413b and a side surface of the diffusion unit 420 facing the second guide 413b. The first adhesive layer 450 may be disposed between an inner surface of the third guide 413c and a side surface of the diffusion unit 420 facing the third guide 413c. The first adhesive layer 450 may be disposed between an inner surface of the fourth guide 413d and a side surface of the diffusion unit 420 facing the fourth guide 413d.

In addition, the first adhesive layer 450 may be disposed between the lower surface of the diffusion unit 420 and the first upper surface of the first sidewall 412. According to the embodiment, as shown in FIGS. 13 and 14, a concave portion 480 may be formed on the upper surface of the first sidewall 412. The concave portion 480 may comprise at least one formed on the upper surface of the first sidewall 412. The concave portion 480 may be formed between the diffusion unit 420 and the upper surface of the first sidewall 412. Since the first adhesive layer 450 is disposed in the concave portion 480, the bonding force between the diffusion unit 420 and the first sidewall 412 can be improved.

The cross section of the concave portion 480 may comprise at least one of a group including a polygon, a circle, and an ellipse. FIG. 14 shows a case in which the cross section of the concave portion 460 is provided in a triangular shape as an example.

The thickness h1 of the concave portion 480, the width h2 of the concave portion 480, and the interval h3 between the concave portions 480 may be selected in consideration of the width w2 of the upper surface of the first sidewall 412, the width w4 of the diffusion unit 420 supported in the vertical direction on the upper surface of the first sidewall 412, and the adhesive strength of the first adhesive layer 450. For example, the thickness h1 of the concave portion 480 may be 45 micrometers to 55 micrometers. The width h2 of the concave portion 480 may be 45 micrometers to 55 micrometers. When a plurality of the concave portions 480 are formed, the interval h3 between the adjacent concave portions 480 may be 80 micrometers to 120 micrometers.

As such, the first adhesive layer 450 allows the diffusion unit 420 to be stably fixed in the second cavity C2. The first adhesive layer 450 allows the diffusion unit 420 to be stably disposed on the second sidewall 413. The first adhesive layer 450 allows the diffusion unit 420 to be stably disposed on the upper surface of the first sidewall 412. Accordingly, in the semiconductor device package according to the embodiment, the space formed by the diffusion unit 420 and the body 400 can be sealed by the first adhesive layer 450, and moisture or foreign matter can be effectively prevented from penetrating into the space where the semiconductor device 430 is disposed, and reliability can be improved.

For example, the first adhesive layer 450 may comprise an organic material. The first adhesive layer 450 may comprise an epoxy-based resin. The first adhesive layer 450 may comprise a silicone-based resin.

According to the embodiment, the support 411 may comprise a first support 411a and a second support 411b. The first support 411a and the second support 411b may be spaced apart from each other. The first support 411a and the second support 411b may be electrically insulated from each other. The semiconductor device 430 may be disposed on the first support 411a or the second support 411b.

The semiconductor device package according to the embodiment may comprise a second adhesive layer 460 disposed between the first support 411a and the second support 411b. The second adhesive layer 460 may electrically insulate the first support 411a and the second support 411b. In addition, the second adhesive layer 460 provides a function of physically and stably coupling the first support 411a and the second support 411b. The second adhesive layer 460 provides electrical insulation and adhesion between the first support 411a and the second support 411b. The package body 410 according to the embodiment may comprise a first package body 410a and a second package body 410b coupled by the second adhesive layer 460.

For example, the second adhesive layer 460 may comprise an organic material. The second adhesive layer 460 may comprise an epoxy-based resin. The second adhesive layer 460 may comprise a silicone-based resin.

The semiconductor device package according to the embodiment may further comprise a metal layer 440 provided between the semiconductor device 430 and the support 411. For example, the semiconductor device 430 may be electrically connected to the first support 411a by wire bonding through a wire 470. In addition, the semiconductor device 430 may be electrically connected to the second support 411b through die bonding. The metal layer 440 may be disposed between the semiconductor device 430 and the second support 411b. For example, the metal layer 440 may be provided in the die bonding region of the semiconductor device 430 and the second support 411b. The metal layer 440 can improve adhesion between the semiconductor device 430, the die paste for die bonding, and the second support 411b. The metal layer 440 may be selected in consideration of the die paste material, the die bonding region material of the semiconductor device 430, and the like. For example, the metal layer 440 may be formed as a single layer or a multilayer including at least one of metals including gold (Au), aluminum (Al), copper (Cu), and silver (Ag). The metal layer 440 may be formed of a single metal or an alloy. For example, the metal layer 240 may be formed by a plating process or the like.

The metal layer 440 may provide a metal bond between the semiconductor device 430 and the support 411. Accordingly, according to the embodiment, heat dissipation characteristics in which heat generated in the semiconductor device 430 is transferred to the support 411 can be improved. Also, from an electrical point of view, the current injection characteristic to be applied to the semiconductor device 430 through the support 411 can be improved. For example, a thickness of the metal layer 440 may be in the range of 0.04 micrometers to 0.4 micrometers. The thickness of the metal layer 440 may be selectively changed according to the process of die bonding. For example, the thickness of the metal layer 440 may be 0.2 micrometers to 0.4 micrometers when eutectic bonding is applied. The thickness of the metal layer 440 may be 0.04 micrometers to 0.06 micrometers when pick and place bonding is applied.

According to the embodiment, as shown in FIG. 12, when viewed from the upper direction, the package body 410 may have a rectangular shape. An example of a method of manufacturing a semiconductor package according to an embodiment will be described later, but the outer surface of the package body 410 may be formed by a cutting process such as dicing. Accordingly, the outer surface of the package body 410 may be formed perpendicular to the upper surface of the support 411. That is, the outer surface 411S of the support 411, the outer surface 412S of the first sidewall 412, and the outer surface 413S of the second sidewall 413 may be arranged on the same plane without a step.

The package body 410 may be formed, for example, by mechanical processing by a tool such as a drill. Accordingly, in the region where the two adjacent sides of the first sidewall 412 meet, an inner surface of a rounded shape having a curvature that is not a straight line may be formed. In other words, the side area of the first cavity C1 formed by the first sidewall 412 may be formed in a linear shape, and the corner area between two neighboring sides may be formed into a shape having a curvature. That is, the first corner region X1, the second corner region X2, the third corner region X3, and the fourth corner region X4 of the first sidewall 412 may be formed as inner sides having a curvature.

The semiconductor device package according to the embodiment described above is based on the case where the semiconductor device 430 is connected to the second support 411b by die bonding and is connected to the first support 411a by wire bonding. However, the electrical connection between the semiconductor device 430 and the support 411 can be variously modified. For example, the semiconductor device 430 may be electrically connected to the support 411 by a flip chip bonding method. Also, the semiconductor device 430 may be electrically connected to the first support 411a and the second support 411b by a wire bonding method.

According to the embodiment, the first support 411a and the second support 411b may be arranged to receive power from the outside. For example, a circuit board for power supply may be disposed under the support 411. The semiconductor device package according to the embodiment can be directly mounted on the circuit board.

In addition, the semiconductor device package according to the embodiment may further comprise an insulation layer provided on the package body 410 to prevent electrical short due to external foreign matter. As an example, a photo solder resist (PSR) may be provided on the package body 410. The photo solder resist (PSR) may be provided on the upper surface of the second sidewall 413 of the package body 410. The photo solder resist (PSR) may be formed on the uppermost surface of the package body 410 and may be formed in an area where the diffusion unit 420 is not disposed. In addition, the photo solder resist (PSR) may be formed on the first adhesive layer 450 exposed by the diffusion unit 420. The photo solder resist (PSR) may also be formed on the second adhesive layer 460 exposed by the diffusion unit 420.

Meanwhile, the concave portion 480 described with reference to FIGS. 11 to 14 can also be applied to the semiconductor device package described with reference to FIGS. 1 to 7. That is, the concave portion 480 may also be formed on the upper surface of the first sidewall 112 of the semiconductor device package described with reference to FIGS. 1 to 3. In addition, the concave portion 480 may be formed on the upper surface of the first sidewall 212 described with reference to FIGS. 4 to 7. When the concave portion is formed on the upper surface of the first sidewalls 112 and 212, a space in which the first adhesive layer 150 and 250 is formed between the diffusion units 120 and 220 and the first sidewalls 112 and 212 can be sufficiently secured. Accordingly, the coupling force between the diffusion units 120 and 220 and the package bodies 110 and 210 can be more improved.

As described above, according to the semiconductor device package of the embodiment, since the package body can be formed of a metal having excellent heat dissipation characteristics, the heat dissipation effect can be improved and the reliability can be improved while realizing a small size.

In addition, according to the semiconductor device package of the embodiment, since the package body is integrally formed of a metal material to provide mechanical stability, even when the semiconductor device package is dropped or receives an external impact, the semiconductor device and the diffusion unit, which are disposed in the package body, are prevented from being damaged, and the reliability can be improved.

In addition, according to the semiconductor device package of the embodiment, when the diffusion unit is coupled with the first sidewall and the second sidewall, the diffusion unit in the upper surface corner region of the first sidewall can be extended without being restricted by the second sidewall. Accordingly, even when the size of the semiconductor device is increased to realize a high output, it is possible to increase the degree of freedom of design that can increase the size of the diffusion unit while realizing a small size of the package body.

Hereinafter, a method of manufacturing a semiconductor device package according to an embodiment of the present invention will be described with reference to FIGS. 15 to 17.

FIGS. 15 to 17 are views showing a method of manufacturing a semiconductor device package according to an embodiment of the present invention. In describing the method of manufacturing the semiconductor device package according to the embodiment, with reference to FIGS. 15 to 17, description of elements overlapping with those described with reference to FIGS. 1 to 14 may be omitted.

First, according to the method of manufacturing the semiconductor device package according to the embodiment of the present invention, a substrate on which a plurality of package bodies P1, P2, P3, and P4 are arrayed as shown in FIG. 15 may be provided. Although the package bodies of P1, P2, P3, and P4 are shown in FIGS. 15 and 16, the array substrate according to the embodiment may comprise a plurality of package bodies arranged in three or more by matrix shapes in the horizontal direction and the vertical direction, respectively. Each of the plurality of package bodies P1, P2, P3, and P4 may correspond to any one of the package bodies 110, 210, 310, and 410 applied to the semiconductor device package described with reference to FIGS. 1 to 14. FIGS. 15 to 17 show the case where the plurality of package bodies P1, P2, P3, and P4 correspond to the package body 310 described with reference to FIGS. 8 to 10.

According to the embodiment, the array substrate may be formed of a metal. The array substrate may comprise at least one of metals including, for example, aluminum (Al), copper (Cu), gold (Au), silver (Ag). The array substrate may be formed of a single metal or an alloy. Each of the plurality of package bodies P1, P2, P3, and P4 may be fabricated to include a first cavity C1 and a second cavity C2. The first cavity C1 and the second cavity C2 may be formed by mechanical processing by a tool such as a drill. The second cavity C2 may be referred to as a recessed region. The periphery of the second cavity C2 may be defined by a first guide 313a, a second guide 313b, a third guide 313c, and a fourth guide 313d. The first guide 313a, the second guide 313b, the third guide 313c, and the fourth guide 313d may be formed on the upper surface of the first sidewall 312. Each of the plurality of package bodies P1, P2, P3, and P4 may comprise a second adhesive layer 360.

The semiconductor device 330 may be disposed in the first cavity C1 of each of the plurality of package bodies P1, P2, P3, and P4. Each of the semiconductor devices 330 may be electrically connected to the corresponding one of the plurality of package bodies P1, P2, P3, and P4.

At this time, as shown in FIG. 16, the semiconductor device 330 may be electrically connected to the package body 310 through wire 370 bonding or die bonding. For example, the semiconductor device 330 may be formed as a wafer level device. In addition, the semiconductor device 330 may be, for example, a vertical cavity surface emitting laser (VCSEL) semiconductor device.

Then, as shown in FIG. 16, a diffusion unit 320 may be disposed on the semiconductor device 330. The diffusion unit 320 may be coupled to the first guide 313a, the second guide 313b, the third guide 313c, and the fourth guide 313d. The diffusion unit 320 may be attached to the first guide 313a, the second guide 313b, the third guide 313c, and the fourth guide 313d by a first adhesive layer 350. The diffusion unit 320 may be supported on the upper surface of the first side surface 312. The diffusion unit 320 may be formed to have a size corresponding to the size of the array substrate, for example, and then be cut to a size that can be coupled to each package body.

Next, the plurality of package bodies P1, P2, P3, and P4 can be separated into individual package bodies by the cutting process according to the cutting line DL shown in FIG. 16. Accordingly, as shown in FIG. 17, an individual semiconductor device package can be formed.

As described above, according to the method of manufacturing the semiconductor device package of the embodiment, since the package body can be formed of a metal having excellent heat dissipation characteristics, the heat dissipation effect can be improved and the reliability can be improved, while realizing a small size.

In addition, according to the method of manufacturing the semiconductor device package of the embodiment, since the package body is integrally formed of a metal material to provide mechanical stability, even if the semiconductor device package is dropped or impacted from the outside, it is possible to prevent the semiconductor device and the diffusion unit from being damaged and improve the reliability.

According to the method of manufacturing the semiconductor device package of the embodiment, when the diffusion unit is coupled to the first sidewall and the second sidewall, the diffusion unit can be extended without being restricted by the second sidewall and be formed in the upper edge corner region of the first sidewall. Accordingly, even when the size of the semiconductor device is increased to realize a high output, it is possible to increase the degree of freedom of design that can increase the size of the diffusion unit while realizing a small size of the package body.

According to the method of manufacturing the semiconductor device of the embodiment, the plurality of package bodies are collectively formed and the wafer level semiconductor device is mounted, thereby simplifying the manufacturing process and reducing the manufacturing cost.

An example of a semiconductor device applied to the semiconductor device package according to the embodiment will now be described with reference to FIGS. 18 and 19. FIG. 18 is a plan view showing a semiconductor device according to an embodiment of the present invention, and FIG. 19 is a sectional view taken along line E-E of the semiconductor device shown in FIG. 18.

The semiconductor device 1100 according to the embodiment may be a vertical cavity surface emitting laser (VCSEL) semiconductor device, as shown in FIGS. 18 and 19.

The semiconductor device 1100 may comprise a light emitting structure 1110, a first electrode 1120, and a second electrode 1160.

The first electrode 1120 may comprise an adhesive layer 1121, a substrate 1123, and a first conductive layer 1125.

The adhesive layer 1121 may comprise a material capable of being subjected to an eutectic bonding. For example, the adhesive layer 1121 may comprise at least one of AuSn, NiSn, and InAu.

The substrate 1123 may be provided as a conductive substrate. The substrate 1123 may comprise at least one of conductive material including copper, gold, nickel, molybdenum, copper-tungsten, and a carrier wafer such as Si, Ge, AlN, SiC, etc. As another example, the substrate 1123 may be provided as a conductive sheet.

On the other hand, when the substrate 1123 is provided as a suitable carrier wafer such as GaAs, the light emitting structure 110 may be grown on the substrate 1123. In such a case, the adhesive layer 1121 may be omitted.

The first conductive layer 1125 may be disposed under the substrate 1123. The first conductive layer 1125 may be selected from group including Ti, Ru, Rh, Ir, Mg, Zn, Al, In, Ta, Pd, Co, Ni, Si, Ge, Ag, Au, and their alloys, and may be provided as a single layer or multiple layers.

The light emitting structure 1110 may comprise a first semiconductor layer 1111, an active layer 1113, an aperture layer 1114, and a second semiconductor layer 1115, which are disposed on the first electrode 1120. The light emitting structure 1110 may be grown as a plurality of compound semiconductor layers. The plurality of compound semiconductor layers may be formed using an electron beam evaporator, physical vapor deposition (PVD), chemical vapor deposition (CVD), plasma laser deposition (PLD), dual-type thermal evaporator sputtering, metal organic chemical vapor deposition (MOCVD) or the like.

The first semiconductor layer 1111 may be provided as at least one of Group III-V or Group II-VI compound semiconductors doped with a dopant of the first conductivity type. For example, the first semiconductor layer 1111 may be one of a group including GaAs, GaAl, InP, InAs, and GaP. The first semiconductor layer 1111 may be provided with a semiconductor material having a composition formula of, for example, $Al_xGa_{1-x}As$ $(0<x<1)/Al_yGa_{1-y}As$ $(0<y<1)$ $(y<x)$. The first semiconductor layer 1111 may be an n-type semiconductor layer doped with an n-type dopant of the first conductivity type dopant such as Si, Ge, Sn, Se, or Te. The first semiconductor layer 1111 may be a DBR (Distributed Bragg Reflector) having a thickness of λ/4n by alternately arranging different semiconductor layers.

The active layer 1113 may be provided as at least one of Group III-V or Group II-VI compound semiconductors. For example, the active layer 1113 may be one of a group including GaAs, GaAl, InP, InAs, and GaP. When the active layer 1113 is implemented as a multi-well structure, the active layer 1113 may comprise a plurality of well layers and a plurality of barrier layers, which are alternately arranged. The plurality of well layers may be provided as a semiconductor material having a composition formula of $In_pGa_{1-p}As$ $(0 \leq p \leq 1)$ as an example. The barrier layer may be disposed of a semiconductor material having a composition formula of $In_qGa_{1-q}As$ $(0 \leq q \leq 1)$ as an example.

The aperture layer 1114 may be disposed on the active layer 1113. The aperture layer 1114 may comprise a circular opening at its center. The aperture layer 1114 may comprise a function of restricting current movement so as to concentrate current to the center of the active layer 1113. That is, the aperture layer 114 can adjust the resonance wavelength and adjust the beam angle to emit light in the vertical direction from the active layer 1113. The aperture layer 1114 may comprise an insulating material such as $SiO_2$ or $Al_2O_3$. The aperture layer 1114 may have a higher band gap than the active layer 1113 and the first and second semiconductor layers 1111 and 1115.

The second semiconductor layer 1115 may be provided as at least one of Group III-V or Group II-VI compound semiconductors doped with a dopant of the second conductivity type. For example, the second semiconductor layer 1115 may be one of a group including GaAs, GaAl, InP, InAs, and GaP. The second semiconductor layer 1115 may be formed of a semiconductor material having a composition formula of, for example, $Al_xGa_{1-x}As$ (0<x<1)/$Al_yGa_{1-y}As$ (0<y<1) (y<x). The second semiconductor layer 1115 may be a p-type semiconductor layer having a p-type dopant such as Mg, Zn, Ca, Sr, or Ba. The second semiconductor layer 1115 may be a DBR having a thickness of λ/4n by alternately arranging different semiconductor layers. The second semiconductor layer 1115 may have a reflectance lower than that of the first semiconductor layer 1111. For example, the first and second semiconductor layers 1111 and 1115 can form a resonant cavity in the vertical direction by a reflectance of 90% or more. At this time, light may be emitted to the outside through the second semiconductor layer 1115 which is lower than the reflectivity of the first semiconductor layer 1111.

The semiconductor device 1100 of the embodiment may comprise a second conductive layer 1140 provided on the light emitting structure 1110. The second conductive layer 1140 is disposed on the second semiconductor layer 1115 and may be disposed along the edge of the light emitting region EA. The second conductive layer 1140 may be of a circular ring type when viewed from the top. The second conductive layer 1140 may comprise an ohmic contact function. The second conductive layer 1140 may be formed of at least one of Group III-V or Group II-VI compound semiconductors doped with a dopant of the second conductivity type. For example, the second conductive layer 1140 may be one of a group including GaAs, GaAl, InP, InAs, and GaP. The second conductive layer 1140 may be a p-type semiconductor layer having a p-type dopant such as Mg, Zn, Ca, Sr, or Ba.

The semiconductor device 1100 of the embodiment may comprise a protective layer 1150 provided on the light emitting structure 1110. The protective layer 1150 may be disposed on the second semiconductor layer 1115. The protective layer 1150 may overlap with the light emitting region EA in the vertical direction.

The semiconductor device 1100 of the embodiment may comprise an insulating layer 1130. The insulating layer 1130 may be disposed on the light emitting structure 1110. The insulating layer 1130 may comprise an insulating material such as an oxide, a nitride, a fluoride, and a sulfide of a material selected from the group including Al, Cr, Si, Ti, Zn, and Zr or an insulating resin. The insulating layer 1130 may be provided as at least one material selected from the group including, for example, $SiO_2$, $Si_3N_4$, $Al_2O_3$, and $TiO_2$. The insulating layer 1130 may be provided as a single layer or multilayers.

The second electrode 1160 may be disposed on the second conductive layer 1140 and the insulating layer 1130. The second electrode 1160 may be electrically connected to the second conductive layer 1140. The second electrode 1160 may be selected from group including Ti, Ru, Rh, Ir, Mg, Zn, Al, In, Ta, Pd, Co, Ni, Si, Ge, and their alloys. The second electrode 1160 may be provided as a single layer or multilayers.

Meanwhile, the semiconductor device package according to the embodiment described above can be applied to a proximity sensor, an autofocusing apparatus, and the like. For example, the autofocusing apparatus according to the embodiment may comprise a light emitting unit that emits light and a light receiving unit that receives light. At least one of the semiconductor device packages described with reference to FIGS. 1 to 14 may be applied as an example of the light emitting unit. A photodiode may be applied as an example of the light receiving unit. The light receiving unit may receive light reflected from the object by the light emitted from the light emitting unit.

The autofocusing apparatus can be applied to various devices such as a mobile terminal, a camera, a vehicle sensor, and an optical communication device. The autofocusing apparatus can be applied to various fields for multi-position detection for detecting the position of a subject.

FIG. 20 is a perspective view of a mobile terminal to which an autofocusing apparatus including the semiconductor device package according to the embodiment of the present invention is applied.

As shown in FIG. 20, the mobile terminal 1500 of the embodiment may comprise a camera module 1520, a flash module 1530, and an autofocusing apparatus 1510, which are provided on the rear surface thereof. Here, the autofocusing apparatus 1510 may comprise one of the semiconductor device packages according to the embodiment described with reference to FIGS. 1 to 14 as a light emitting unit.

The flash module 1530 may comprise a light emitting device for emitting light. The flash module 1530 can be operated by the camera operation of the mobile terminal or the user's control. The camera module 1520 may comprise an image photographing function and an auto focus function. For example, the camera module 1520 may comprise an auto focus function using an image.

The autofocusing apparatus 1510 may comprise an autofocusing function using a laser. The autofocusing apparatus 1510 may be used mainly in a close of 10 m or less or dark environment, for example, under conditions where the autofocus function using the image of the camera module 1520 is deteriorated. The autofocusing apparatus 1510 may comprise a light emitting unit including a vertical cavity surface emitting laser (VCSEL) semiconductor device and a light receiving unit, such as a photodiode, that converts light energy into electric energy.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

INDUSTRIAL APPLICABILITY

According to the semiconductor device package of the embodiment, the semiconductor device package is small in size and has good heat dissipation characteristics.

According to the semiconductor device package of the embodiment, there is an advantage that the mechanical stability is excellent and the elements disposed inside can be safely protected from external impacts.

According to the semiconductor device package of the embodiment, there is an advantage that it can provide high output light and prevent moisture from penetrating into the inside.

According to the method of manufacturing the semiconductor device package of the embodiment, there is an advantage that the semiconductor device package which is small in size and excellent in heat dissipation characteristics and provides high output light can be manufactured quickly and stably.

According to the method of manufacturing the semiconductor device package of the embodiment, the manufacturing process can be simplified and the manufacturing cost can be reduced.

According to the autofocusing apparatus of the embodiment, there is an advantageous that it is small in size, has excellent heat dissipation characteristics, and can provide high output light.

The invention claimed is:

1. A semiconductor device package, comprising:
   a package body comprising a support, a first sidewall protruding from an edge region of an upper surface of the support to a first thickness and having a first upper surface of a first width, and a second sidewall protruding from the first upper surface of the first sidewall to a second thickness and having a second upper surface of a second width, and the support, the first sidewall, and the second sidewall being formed by one body of a metal;
   a diffusion unit disposed on the first upper surface of the first sidewall and surrounded by the second sidewall; and
   a vertical cavity surface emitting laser (VCSEL) semiconductor device disposed on the support and disposed under the diffusion unit,
   wherein the first sidewall is provided in a rectangular shape when viewed from above,
   wherein the first upper surface of the first sidewall comprises a first corner region, a second corner region next to the first corner region, a third corner region next to the second corner region and facing the first corner region, and a fourth corner region next to the third corner region and facing the second corner region,
   wherein the second sidewall comprises a first guide disposed between the first corner region and the fourth corner region, a second guide disposed between the first corner region and the second corner region, a third guide disposed between the second corner region and the third corner region, and a fourth guide disposed between the third corner region and the fourth corner region,
   wherein the first, second, third, and fourth guides are not disposed on the first, second, third, and fourth corner regions, and
   wherein the diffusion unit is surrounded by the first, second, third, and fourth guides.

2. The semiconductor device package of claim 1, wherein an outer surface of the support, an outer surface of the first sidewall, and an outer surface of the second sidewall are provided in one plane without a step.

3. The semiconductor device package of claim 1, wherein a thickness of the vertical cavity surface emitting laser (VCSEL) semiconductor device is smaller than the first thickness of the first sidewall.

4. The semiconductor device package of claim 1, wherein a thickness of the diffusion unit is equal to or less than the thickness of the second sidewall.

5. The semiconductor device package of claim 1, further comprising an adhesive layer provided between the diffusion unit and the second sidewall.

6. The semiconductor device package of claim 1, wherein the support comprises a first support and a second support that are spaced apart from each other and are electrically insulated, and the vertical cavity surface emitting laser (VCSEL) semiconductor device is disposed on the first support or the second support, and
   wherein the semiconductor device package further comprises an adhesive layer provided between the first support and the second support.

7. The semiconductor device package of claim 1, comprising a metal layer disposed between the vertical cavity surface emitting laser (VCSEL) semiconductor device and the support.

8. The semiconductor device package of claim 1, wherein the package body comprises at least one of metals including Al, Cu Au, and Ag.

9. The semiconductor device package of claim 1, wherein an inner side surface of the second sidewall is formed in a plurality of stepped shapes.

10. The semiconductor device package of claim 1, wherein a width of the upper surface of the first sidewall is equal to a width of a lower surface of the first sidewall.

11. The semiconductor device package of claim 1, comprising a concave portion provided at the first upper surface of the first sidewall supporting the diffusion unit.

12. The semiconductor device package of claim 11, comprising an adhesive layer disposed between the concave portion and a lower surface of the diffusion unit.

13. The semiconductor device package of claim 1, wherein the second sidewall comprises the second upper surface having the second width, and
   wherein a lower surface of the second sidewall is provided wider than the second width and smaller than the first width of the first upper surface of the first sidewall.

14. The semiconductor device package of claim 1, wherein a rounded side surface having a curvature is provided in a region where two adjacent sides of the first sidewall meet.

15. A method of manufacturing a semiconductor device package, comprising:
   providing a metal substrate;
   forming a plurality of package bodies by processing the metal substrate, each of the plurality of package bodies includes a support, a first sidewall protruding from an edge region of an upper surface of the support to a first thickness and having a first upper surface of a first width, and a second sidewall protruding from the first upper surface of the first sidewall to a second thickness and having a second upper surface of a second width;

providing a vertical cavity surface emitting laser (VCSEL) semiconductor device on a region of the support surrounded by the first sidewall of each package body, respectively;

providing a diffusion unit in a region surrounded by the second sidewall, the diffusion unit being supported by the first upper surface of the first sidewall of each of the package bodies; and dicing and separating the metal substrate into a plurality of semiconductor device packages, each semiconductor device package including the package body, the vertical cavity surface emitting laser (VCSEL) semiconductor device, and the diffusion unit, wherein the first sidewall is provided in a rectangular shape when viewed from above, wherein the first upper surface of the first sidewall comprises a first corner region, a second corner region next to the first corner region, a third corner region next to the second corner region and facing the first corner region, and a fourth corner region next to the third corner region and facing the second corner region, wherein the second sidewall comprises a first guide disposed between the first corner region and the fourth corner region, a second guide disposed between the first corner region and the second corner region, a third guide disposed between the second corner region and the third corner region, and a fourth guide disposed between the third corner region and the fourth corner region, wherein the first, second, third, and fourth guides are not disposed on the first, second, third, and fourth corner regions.

16. A semiconductor device package, comprising:

a package body comprising a support, a first sidewall protruding from an edge region of an upper surface of the support to a first thickness and having a first upper surface of a first width, and a second sidewall protruding from the first upper surface of the first sidewall to a second thickness and having a second upper surface of a second width;

a diffusion unit disposed on the first upper surface of the first sidewall; and a vertical cavity surface emitting laser (VCSEL) semiconductor device disposed on the support and disposed under the diffusion unit, wherein the first sidewall is provided in a rectangular shape when viewed from above, wherein the first upper surface of the first sidewall comprises a first corner region, a second corner region next to the first corner region, a third corner region next to the second corner region and facing the first corner region, and a fourth corner region next to the third corner region and facing the second corner region, wherein the second sidewall comprises a first guide disposed between the first corner region and the fourth corner region, a second guide disposed between the first corner region and the second corner region, a third guide disposed between the second corner region and the third corner region, and a fourth guide disposed between the third corner region and the fourth corner region, wherein an inner side surface of the first guide and an inner side surface of the third guide are disposed to face each other, and an inner side surface of the second guide and an inner side surface of the fourth guide are disposed to face each other, wherein the first, second, third, and fourth guides are not disposed on the first, second, third, and fourth corner regions, and wherein the diffusion unit is surrounded by the first, second, third, and fourth guides.

17. The semiconductor device package of claim 16, comprising a concave portion provided at the first upper surface of the first sidewall supporting the diffusion unit.

18. The semiconductor device package of claim 17, comprising an adhesive layer disposed between the concave portion and a lower surface of the diffusion unit.

19. The semiconductor device package of claim 16, wherein the package body comprises at least one of metals including Al, Cu Au, and Ag, and wherein an outer surface of the support, an outer surface of the first sidewall, and an outer surface of the second sidewall are provided in one plane without a step.

20. The semiconductor device package of claim 16, comprising an adhesive layer provided between the diffusion unit and the second sidewall.

* * * * *